United States Patent
Kodaira et al.

(10) Patent No.: US 9,773,973 B2
(45) Date of Patent: Sep. 26, 2017

(54) PROCESS FOR PRODUCING MAGNETORESISTIVE EFFECT ELEMENT AND DEVICE PRODUCING METHOD

(71) Applicant: CANON ANELVA CORPORATION, Kawasaki-shi, Kanagawa (JP)

(72) Inventors: Yoshimitsu Kodaira, Kawasaki (JP); Isao Takeuchi, Kawasaki (JP); Mihoko Nakamura, Kawasaki (JP)

(73) Assignee: CANON ANELVA CORPORATION, Kawasaki-Shi, Kanagawa (JP)

( * ) Notice: Subject to any disclaimer, the term of this patent is extended or adjusted under 35 U.S.C. 154(b) by 9 days.

(21) Appl. No.: 14/646,443

(22) PCT Filed: Nov. 14, 2013

(86) PCT No.: PCT/JP2013/080743
§ 371 (c)(1),
(2) Date: May 21, 2015

(87) PCT Pub. No.: WO2014/080823
PCT Pub. Date: May 30, 2014

(65) Prior Publication Data
US 2016/0005957 A1    Jan. 7, 2016

(30) Foreign Application Priority Data

Nov. 26, 2012  (JP) .................................. 2012257368

(51) Int. Cl.
*H01L 21/3065* (2006.01)
*H01L 43/12* (2006.01)
*H01J 37/305* (2006.01)

(52) U.S. Cl.
CPC .......... *H01L 43/12* (2013.01); *H01J 37/3056* (2013.01); *H01L 21/3065* (2013.01);
(Continued)

(58) Field of Classification Search
CPC .................... H01L 29/66007; H01L 29/66409
See application file for complete search history.

(56) References Cited

U.S. PATENT DOCUMENTS

2006/0278611 A1* 12/2006 Sato .......................... C23F 4/00
                                                              216/66
2010/0155231 A1   6/2010 Watanabe et al.
(Continued)

FOREIGN PATENT DOCUMENTS

JP         2008-218829 A    9/2008
JP         2009-87474 A     4/2009
(Continued)

OTHER PUBLICATIONS

Office Action dated Feb. 23, 2016, by the Taiwanese Patent Office in corresponding Taiwanese Patent Application No. 102142087, and an English translation of the Office Action. (6 pages).
(Continued)

*Primary Examiner* — Cheung Lee
(74) *Attorney, Agent, or Firm* — Buchanan Ingersoll & Rooney PC

(57) ABSTRACT

A production process in which in an element isolation process for a magnetoresistive effect element, a re-deposited film adhered to a side wall of the element is efficiently removed by ion beam etching. Ion beam etching is performed while a substrate located being inclined relative to the grid is rotated. In the ion beam etching, an energy amount of an ion beam entering from a direction in which a pattern groove formed on the substrate extends is increased larger than the energy amount of the ion beam entering from another direction by controlling a rotation speed of the substrate, and the re-deposited film adhered to the side wall of the magnetoresistive effect element formed on the substrate is efficiently removed by etching.

12 Claims, 24 Drawing Sheets

(52) U.S. Cl.
CPC ............... *H01J 2237/20214* (2013.01); *H01J 2237/304* (2013.01)

(56) References Cited

U.S. PATENT DOCUMENTS

| | | | |
|---|---|---|---|
| 2011/0032645 A1 | 2/2011 | Noel et al. | |
| 2011/0198314 A1 | 8/2011 | Wang et al. | |
| 2013/0241015 A1* | 9/2013 | Nomachi | H01L 43/08 257/421 |
| 2013/0316536 A1 | 11/2013 | Seto et al. | |
| 2015/0090583 A1 | 4/2015 | Kodaira et al. | |

FOREIGN PATENT DOCUMENTS

| | | |
|---|---|---|
| JP | 2011-071526 A | 4/2011 |
| JP | 2011-166157 A | 8/2011 |
| JP | 2012-142398 A | 7/2012 |
| JP | 2013-243307 A | 12/2013 |
| WO | WO 2014/002336 A1 | 1/2014 |

OTHER PUBLICATIONS

International Search Report (PCT/ISA/210) dated Jan. 28, 2014, by the Japanese Patent Office as the International Searching Authority for International Application No. PCT/JP2013/080743.
Taiwan Office Action dated Mar. 27, 2015 for Taiwan Application No. 102142087.
Office Action (Notification of Reasons for Refusal) dated May 17, 2016, by the Japanese Patent Office in Japanese Patent Application No. 2014-548534 and English translation of the Office Action. (17 pages).
International Preliminary Report on Patentability (PCT/IB/373) dated May 26, 2015, including the Written Opinion of the International Searching Authority (PCT/ISA/237), issued by the International Bureau of WIPO for International Application No. PCT/JP2013/080743, 7 pages.
English Translation of Taiwan Office Action with attached Taiwan IPO Search Report for Taiwan Application No. 102142087, translation dated Jun. 2, 2015, 4 pages.

\* cited by examiner

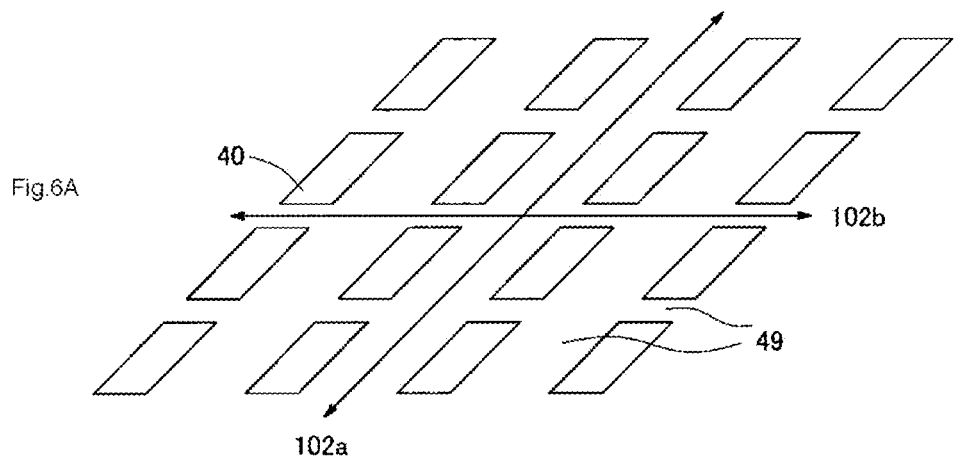
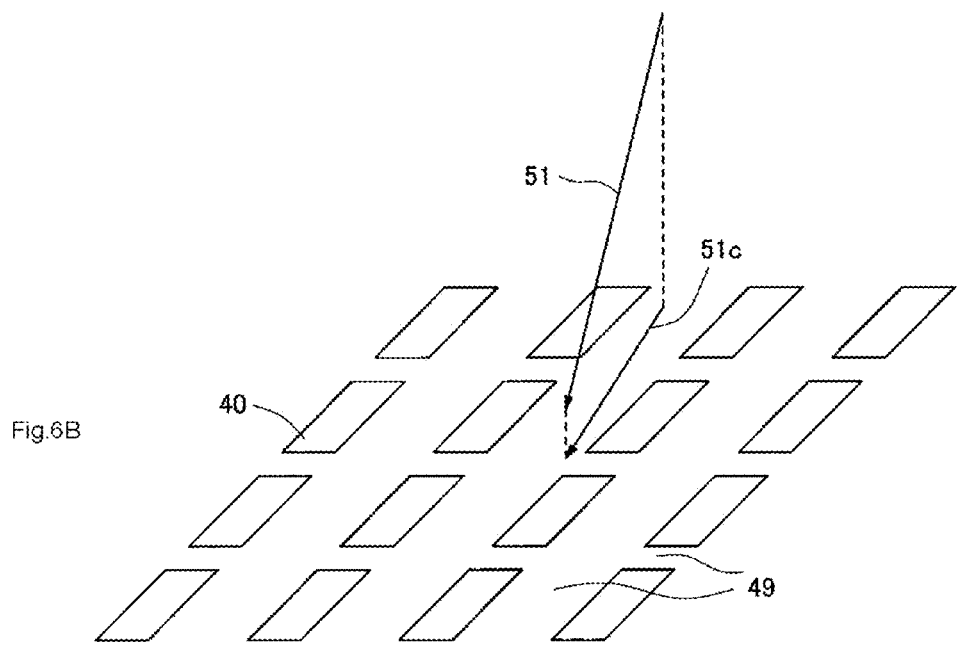

PROCESS FOR PRODUCING MAGNETORESISTIVE EFFECT ELEMENT AND DEVICE PRODUCING METHOD

TECHNICAL FIELD

The present invention relates to a process for producing a magnetoresistive effect element, which includes a process for effectively removing a re-deposited film adhered to a side surface of the magnetoresistive effect element in a process for isolating the magnetoresistive effect element, and a device producing method using the production process.

BACKGROUND ART

Magnetic Random Access Memory (MRAM) is a non-volatile memory having a TMR element using a magnetoresistive effect (Tunneling Magneto Resistive: TMR) and has integration density similar to Dynamic Random Access Memory (DRAM) and a high speed performance similar to Static Random Access Memory (SRAM), and the world pays attention to MRAM as a revolutionary next-generation memory in which data is rewritten repeatedly.

The TMR element basically has a magnetization resistance effect film provided between an upper electrode and a lower electrode and having a tunnel barrier layer sandwiched between a magnetization fixing layer (hereinafter also referred to as a "pin layer") and a magnetization free layer (hereinafter also referred to as a "free layer") and is located at an intersection between a word line and a bit line used in reading and writing signals. The TMR element is used as a memory cell when the upper electrode and the lower electrode of the TMR element are connected to wiring.

When a current flows into the TMR element, the current vertically flows from the lower electrode to the upper electrode. A level of an electric resistance value of a current flowing through an insulating layer is changed between "0" and "1" by freely changing the direction of the magnetization of the magnetization free layer which is a ferromagnetic layer, and information is exchanged with metal wiring, whereby a signal is read or written.

An ion beam etching (hereinafter also referred to as "IBE") technique is used as a method of processing the TMR element. In the IBE, an electrical power is supplied to a discharge portion to generate a plasma, and, thus, to draw ions from the plasma through application of voltage to a grid, whereby an ion beam is formed. The ion beam enters a substrate and mainly physically etches a material on the substrate.

In the process for producing the TMR element, a magnetoresistive effect film formed on a substrate is processed by various etching methods such as IBE, reactive ion etching (hereinafter also referred to as "RIE"), and reactive IBE and isolated into individual TMR elements. When the magnetoresistive effect film is processed in accordance with a pattern, an etched material is partially physically etched and scattered from the substrate. The scattered etched material is partially adhered again to a side wall of the TMR element and deposited thereon. When the re-deposited film is adhered to a side wall of the tunnel barrier layer, the magnetization fixing layer and the magnetization free layer are short-circuited by the re-deposited film, so that the function as the TMR element is lost.

Patent Literature 1 discloses a technique of, in the element isolation of the TMR element, forming, in a stepwise manner, an insulating layer on a side wall exposed by etching to form an insulating layer on the side surface before adhesion of a re-deposited film, and, thus, to prevent short-circuiting of the TMR element due to the re-deposited film.

PRIOR ART REFERENCE

Patent Literature

Patent Literature 1: Japanese Patent Application Laid-Open No. 2008-218829

SUMMARY OF THE INVENTION

Problem to be Solved by the Invention

However, to form the insulating layer on the side wall in a step-wise manner in the element isolation process for the TMR element, a process for laminating and patterning insulating materials is required to be performed a plurality of times. This complicates the production process and increases the production cost.

An object of the present invention is to provide a process for producing a TMR element which efficiently removes a re-deposited film adhered to a side wall of a TMR element in an element isolation process and thereby can reduce occurrence of short-circuiting. Another object of the present invention is to provide a method of producing other devices using an ion beam etching method used in the production process.

Means for Solving the Problem

The first invention provides a process for producing a magnetoresistive effect element having two ferromagnetic layers and a tunnel barrier layer located between the two ferromagnetic layers. This production process includes a process for providing a substrate in which the tunnel barrier layer is element-isolated and an ion beam etching process for ion-beam etching the substrate with an ion beam extracted from a grid. The ion beam etching process features that the substrate is located being inclined relative to the grid, and an energy amount of the ion beam entering from a direction in which a pattern groove formed on the substrate extends is larger than the energy amount of the ion beam entering from another direction.

The second invention provides a device producing method. This device producing method includes a process for providing a substrate on which a pattern is formed and an ion beam etching process for ion-beam etching a side wall of the pattern with an ion beam extracted from a grid. The ion beam etching process features that the substrate is located being inclined relative to the grid, and an energy amount of the ion beam entering from a direction in which a pattern groove formed on the substrate extends is larger than the energy amount of the ion beam entering from another direction.

Effects of Invention

In the present invention, in the process for removing the re-deposited film, adhered to the side wall of the TMR element in the element isolation process, through oblique incidence in IBE, the energy amount of the ion beam in a direction allowing easy processing and the energy amount of the ion beam in a direction in which processing is difficult are different from each other. This invention can provide a TMR element having a fine pattern with reduced short circuiting by efficiently removing the re-deposited film. In a device in which troubles occur due to adhesion of a film to the side wall in the IBE process, when a similar process for removing a re-deposited film is added, a device having good device characteristics can be provided.

BRIEF DESCRIPTION OF THE DRAWINGS

FIGS. 6A and 6B are schematic perspective views showing a state in which the ion beam enters the substrate.

FIG. 19A is a plan view, FIG. 19B is a partially enlarged view of FIG. 19A, and FIG. 19C is a cross-sectional view of FIG. 19B.

MODE FOR CARRYING OUT THE INVENTION

Figure 1:
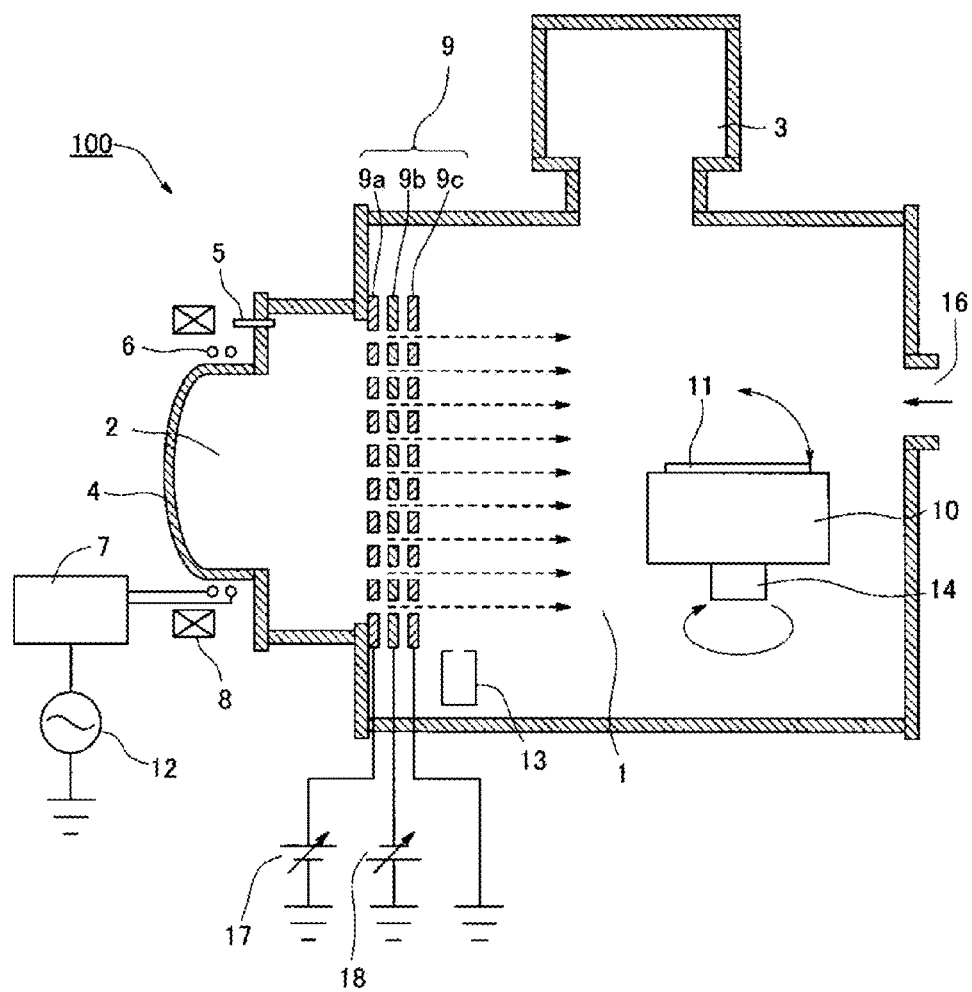
FIG. 1 is a schematic cross-sectional view showing a configuration of an example of an IBE apparatus used in an IBE process for removing a re-deposited film in the present invention.

Hereinafter, although embodiments of the present invention will be described with reference to the drawings, this invention is not limited to the embodiments and may be suitably modified without departing from the scope of the invention. In the drawings to be described below, the same functional elements are indicated by the same reference numerals, and descriptions thereof will not be repeated.

First Embodiment

FIG. 1 is a schematic cross-sectional view showing a configuration of an example of an IBE apparatus 100 used in an IBE process for removing a re-deposited film according to the present invention. The IBE apparatus 100 is constituted of a processing space 1 and a plasma generation portion 2 as a plasma source. The processing space 1 includes an exhaust pump 3. The plasma generation portion 2 includes a bell jar 4, a gas introduction portion 5, an RF antenna 6, a matching device 7, and an electromagnet 8. A boundary portion between the processing space 1 and the plasma generation portion 2 includes a grid 9.

The grid 9 is constituted of a plurality of sheets of electrodes. In the present invention, the grid 9 is constituted of three sheets of electrodes as shown in, for example, FIG. 1. The electrodes are a first electrode 9a as an extraction electrode, a second electrode 9b as an acceleration electrode, and a third electrode 9c as a ground electrode, in this order from a side of the bell jar 4. Positive and negative voltages are applied respectively to the first electrode 9*a* and the second electrode 9*b*, whereby ions are accelerated by a potential difference. The third electrode 9*c* is grounded. When the potential difference between the second electrode 9*b* and the third electrode 9*c* is controlled, the diameter of an ion beam can be controlled within a predetermined numerical value range using an electrostatic lens effect. The ion beam is neutralized by a neutralizer 13.

The grid 9 is formed of molybdenum, titanium, titanium carbide, pyrolytic graphite, or the like. The grid 9 may be formed of other material than those exemplified, and its surface may be coated with molybdenum, titanium, or titanium carbide. When a reactive gas is used as a process gas, the grid 9 is preferably formed of a material having resistance against the process gas.

The processing space 1 includes a substrate holder 10 connected to an electrostatic chuck (ESC) electrode (not shown). The ESC electrode allows a substrate 11 placed on the substrate holder 10 to be fixed by electrostatic attraction. As other substrate fixing means, various fixing means such as clamp supporting may be used. A process gas is introduced from the gas introduction portion 5, and a high frequency wave is applied to the RF antenna 6, whereby a plasma of an etching gas can be generated in the plasma generation portion 2. Then, a direct-current voltage is applied to the grid 9 to extract ions as a beam from the plasma generation portion 2, and, thus, to apply the ion beam to the substrate 11, whereby the substrate 11 is processed. The extracted ion beam is electrically neutralized by the neutralizer 13 and applied to the substrate 11.

The substrate holder 10 allows the substrate 11 to rotate (on its axis) in an in-plane direction of the substrate 11. The substrate holder 10 has rotation control means for controlling a rotation speed of the substrate, the number of times of rotation of the substrate, and inclination of the substrate holder 10 relative to the grid 9 and means for detecting a rotation position of the substrate. The substrate holder 10 may further have means allowing detection of a rotation start position of the substrate 11. In this embodiment, the substrate holder 10 is equipped with a position sensor 14 as position detection means, and the position sensor 14 can detect the rotation position of the substrate 11. As the position sensor 14, a rotary encoder is used. The position sensor 14 may have any other configuration that allows for detection of the rotation position of the rotating substrate 11, like the rotary encoder.

In this embodiment, although the rotation position of the substrate 11 held by the substrate holder 10 is detected by directly detecting the rotation position of the substrate 11 and the substrate holder 10 by a sensor such as the position sensor 14, any other configuration that allows for detection of the rotation position of the substrate 11 may be used. For example, the rotation position of the substrate 11 may be indirectly obtained by calculation from the rotation speed and a rotation time of the substrate holder 10.

The rotation start position of the substrate 11 is obtained by detecting an orientation flat and a notch of the substrate 11. Alternatively, the rotation start position can be obtained with higher accuracy by detecting an alignment mark and alignment of a pattern on the substrate 11. The position sensor 14 may be used as a rotation start position sensor for the substrate 11, or detection means for detecting the alignment mark and the pattern alignment may be provided separately from the position sensor 14. As the detection means, an atomic force microscope, an optical measuring microscope, or a scanning electron microscope may be provided in a conveyance path (not shown), or a measuring apparatus mounted with the measure may be provided adjacent to the IBE apparatus 100.

The substrate 11 is held on a placing surface of the substrate holder 10 while keeping the horizontal state of the substrate 11. Although the substrate 11 may be constituted of a disk-shaped silicon wafer, for example, the present invention is not limited thereto. The substrate holder 10 can arbitrarily incline relative to an ion beam, so that an incidence angle of the ion beam entering the substrate 11 can be adjusted.

Figure 2:
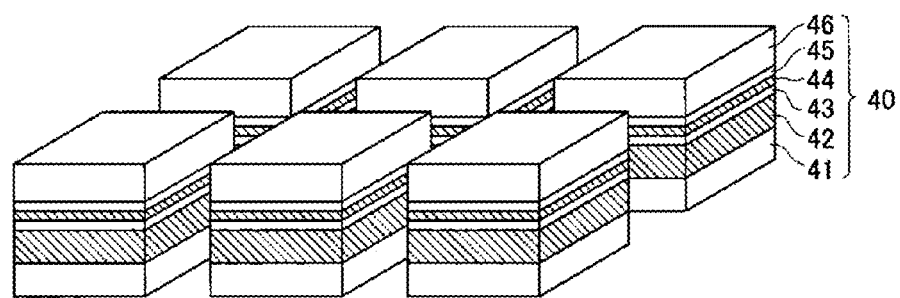
FIG. 2 is a schematic perspective view showing a configuration of a TMR element produced according to this invention.

A TMR element 40 produced according to the present invention is basically configured as shown in FIG. 2 such that a magnetization resistance effect film and an antiferromagnetic layer 42 are arranged between an upper electrode 46 and a lower electrode 41. In the magnetization resistance effect film, a tunnel barrier layer 44 as a basic configuration is sandwiched between a magnetization fixing layer 45 and a magnetization free layer 43 as ferromagnetic layers. The TMR element 40 of FIG. 1 has a top pin structure in which the magnetization fixing layer 45 is located in an upper portion of the TMR element 40.

Figure 3A:
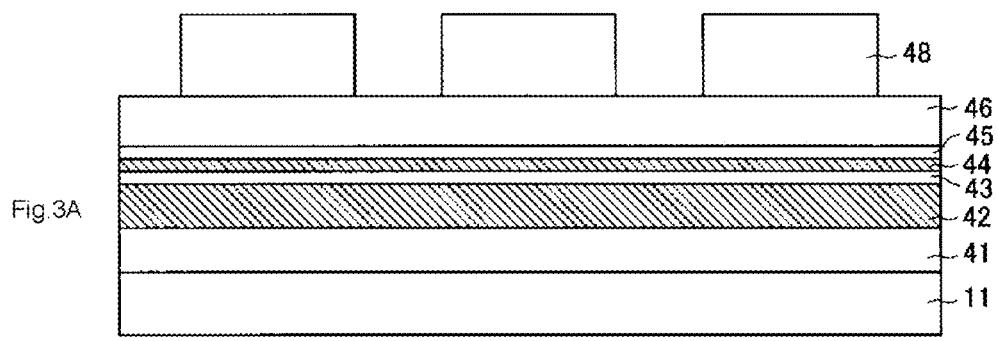
FIGS. 3A to 3C are schematic cross-sectional views showing an element isolation process and an IBE process for removing a re-deposited film in a process for producing a TMR element.
Figure 3B:
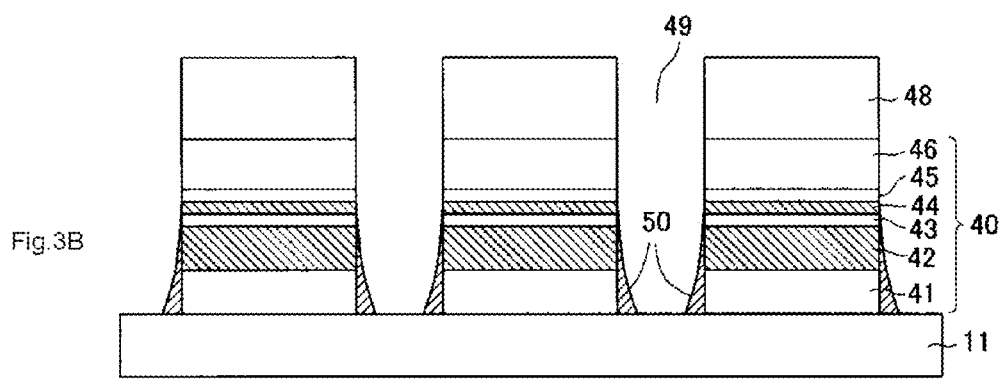

In the production of the TMR element 40 of FIG. 2, first, as shown in FIG. 3A, the lower electrode 41, the antiferromagnetic layer 42, the magnetization free layer 43, the tunnel barrier layer 44, the magnetization fixing layer 45, and the upper electrode 46 are commonly laminated on the substrate 11 with respect to a plurality of TMR elements, and photo resists 48 which protect regions as the individual TMR elements 40 are formed. After that, a pattern groove 49 is formed by ion beam etching (IBE) or reactive ion etching (RIE), as shown in FIG. 3B, whereby the TMR element 40 is element-isolated. A material removed by etching in the element isolation is adhered to a side wall of the TMR element 40 to form a re-deposited film 50.

Figure 3C:
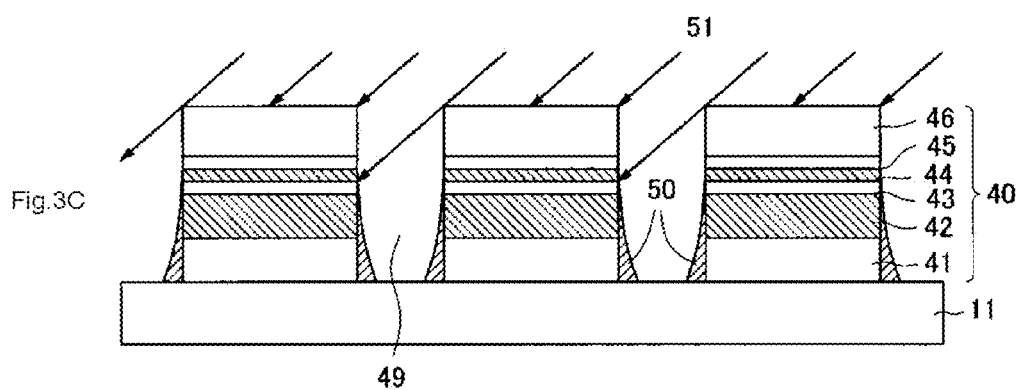

Although the re-deposited film 50 can be removed (trimmed) by IBE, the incidence angle of an ion beam entering the substrate 11 is required to approach an angle more parallel to a surface of the substrate 11 at this time. In the IBE, when the ion beam enters the substrate 11 from an oblique direction, the substrate 11 is rotating. However, there is a direction in which the ion beams 51 are partially blocked by the TMR elements 40 adjacent to each other depending on a rotation phase of the substrate 11, as shown in FIG. 3C, to make removal of the re-deposited film 50 difficult. Meanwhile, when the ion beam 51 enters from a direction perpendicular to the paper surface of FIG. 3C, when no member obstructing the pattern groove 49, the re-deposited film 50 can be well removed by etching.

According to the present invention, in view of the circumstances in which the efficiency of the etching removal of the re-deposited film 50 is different depending on the incidence direction of the ion beam 51, etching is performed preferentially in a direction in which the re-deposited film 50 is easily removed by etching, whereby the re-deposited film 50 is removed efficiently in a shorter time to produce a TMR element.

Figure 4:
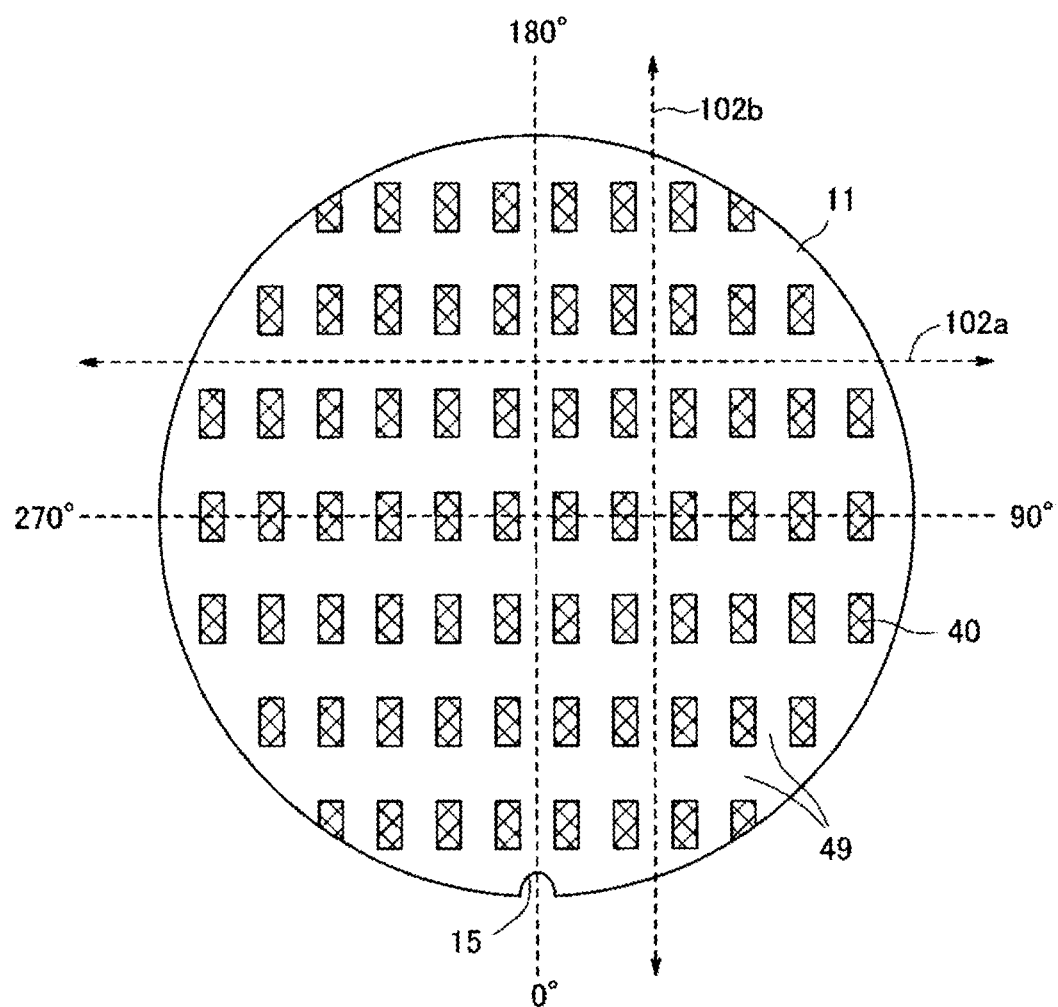
FIG. 4 is a plan pattern diagram of an example of a substrate to which a production process of this invention is applicable.

FIG. 4 shows an example of the substrate 11 to which the present invention is applicable. FIG. 4 schematically shows an enlarged pattern of the TMR elements 40 formed on the substrate 11. A large number of the TMR elements 40 are formed on the substrate 11. The TMR elements 40 are arranged along the two-way pattern groove 49. In this embodiment, the substrate 11 placed on the substrate holder 10 of FIG. 1 is located being inclined relative to the grid 9, and IBE is performed while changing the rotation speed of the substrate holder 10, whereby in the IBE process, an amount of the ion beams emitted from directions 102*a* and 102b in which the pattern grooves 49 extend is larger than an amount of the ion beams emitted from other directions.

Figure 5:
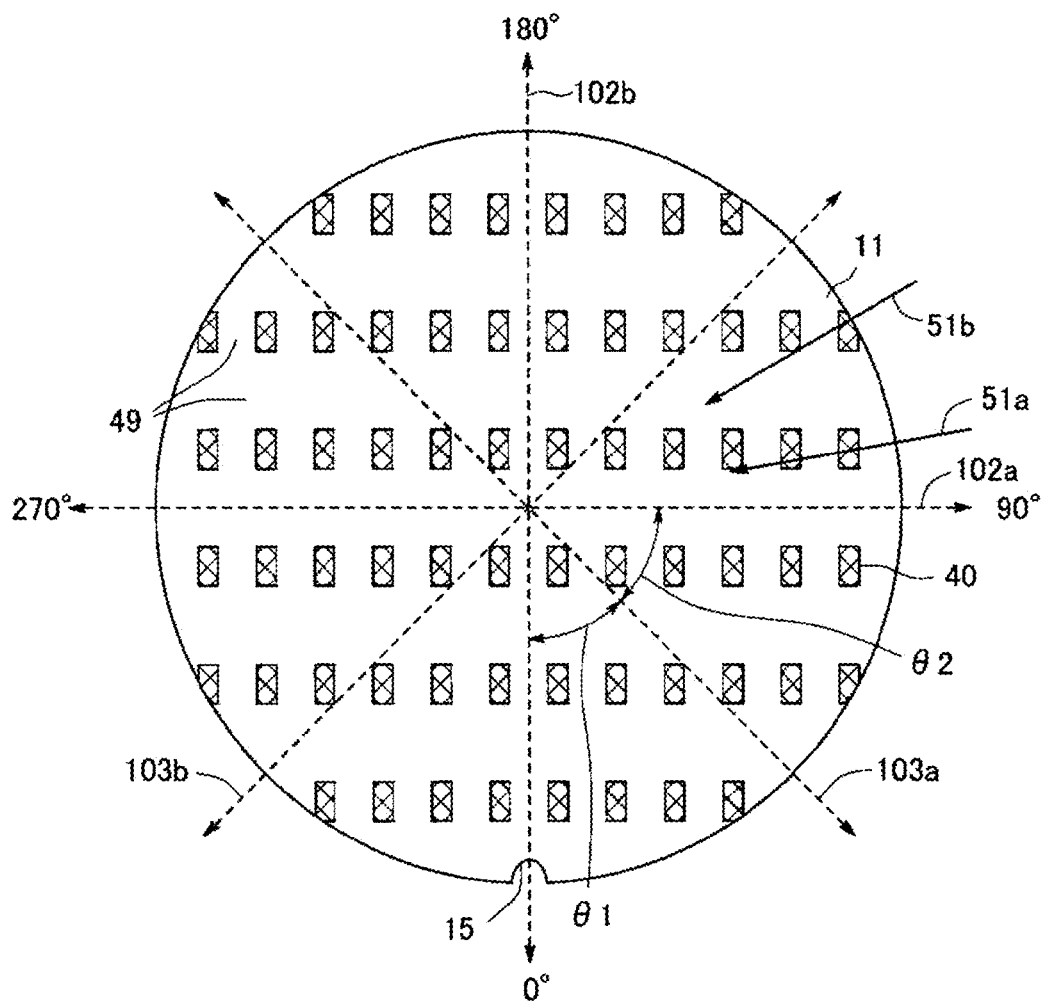
FIG. 5 is a plan pattern diagram of a substrate showing an ion beam entering from a direction in which pattern grooves extend and an ion beam entering from another direction.

The amount of the ion beams emitted from the directions 102a and 102b in which the pattern grooves 49 extend is compared with the amount of the ion beams emitted from other directions using FIG. 5.

First, we will examine a segment obtained when the ion beam 51 extracted from the grid 9 is projected onto the surface of the substrate 11. The projected segment is decomposed into components in the directions 102a and 102b in which the pattern grooves 49 extend and components in directions 103a and 103b as intermediate directions of the directions 102a and 102b. The projected segment can be compared by comparing the magnitudes of the directions 102a and 102 with the magnitudes of the directions 103a and 103b.

In this embodiment, as shown in FIG. 5, since the angles on the substrate 11 are set, the direction 102a corresponds to the direction directed from 90° to 270° and the direction directed from 270° to 90°, and the direction 102b corresponds to the direction directed from 0° to 180° and the direction directed from 180° to 0°, the directions 102a and 102b are the directions in which the pattern grooves 49 extend. The directions 103a and 103b are the intermediate directions between the directions 102a and 102b. The direction 103a corresponds to the direction directed from 45° to 225° and the direction directed from 225° to 45°, and the direction 103b corresponds to the direction directed from 135° to 315° and the direction directed from 315° to 135°.

We will consider the ion beam 51a emitted from the direction at an angle of 100° and the ion beam 51b emitted from the direction at an angle of 120° when the substrate 11 is in the state shown in FIG. 5.

The angle formed by the ion beam 51a with respect to the direction 102a is 10°, and the angle formed by the ion beam 51a with respect to the direction 103b is 35°. In comparing the component in the direction 102a of the ion beam 51a to the component in the direction 103b of the ion beam 51a, cos 10°: cos 35° is approximately 0.98:0.82, and the component in the direction 102a is larger than the component in the direction 103b.

Meanwhile, the angle formed by the ion beam 51b with respect to the direction 102a is 30°, and the angle formed by the ion beam 51b with respect to the direction 103b is 15°. In comparing the component in the direction 102a of the ion beam 51b to the component in the direction 103b of the ion beam 51b, cos 30°: cos 15° is approximately 0.87:0.97, and the component in the direction 103b is larger than the component in the direction 102a.

Accordingly, it can be said that while the ion beam 51a is the ion beam entering from the direction 102a in which the pattern grooves 49 extend, the ion beam 51b is the ion beam entering from the intermediate direction 103b.

In the above example, for ease of comparison, comparison is performed using a cos function between the component in the direction 102a of the ion beam 51a and the component in the direction 103b of the ion beam 51b. However, comparison may be performed by decomposing each ion beam into a vector component in the direction 102a and a vector component in the direction 103b.

The ion beams entering from the directions 102a and 102b in which the pattern grooves 49 extend more easily contribute to trimming of the re-deposited film 50 on the side wall of the TMR element 40 than the ion beams entering from the directions 103a and 103b.

The projection of the ion beam onto the substrate 11 will be specifically described using FIGS. 6A and 6B. FIG. 6A shows a partially enlarged state of the substrate 11, and the TMR elements 40 are formed on the substrate 11. FIG. 6A further shows the directions 102a and 102b at that time in which the pattern grooves 49 extend. In FIGS. 6A and 6B, the TMR elements 40 are shown as bottom surfaces occupying the surface of the substrate 11.

Meanwhile, FIG. 6B shows a state in which the ion beam 51 enters the substrate 11 similar to that of FIG. 6A. At this time, a segment 51c is determined when the ion beam 51 is projected onto the substrate 11. In the segment 51c, the incidence direction of the ion beam 51 can be confirmed by comparing the components in the directions 102a and 102b in which the pattern grooves 49 extend and the component in the intermediate directions (103a and 103b of FIG. 5).

Although the substrate 11 is located being inclined relative to the grid 9, this specifically means that the grid 9 and the substrate 11 are located at a position where a central normal line of the substrate 11 crosses to a central normal line of the grid 9 with a predetermined angle. Namely, in this location, the grid 9 and the substrate 11 are parallel to each other, and when the angle formed by the central normal line of the grid 9 and the central normal line of the substrate holder 10 is 0° and the angle at which the central normal line of the grid 9 crosses perpendicularly to the central normal line of the substrate 11 is 90°, the angle of the substrate 11 with respect to the grid 9 is set in a range of from 0° to 90° (0° and 90° are not included in this range). The set angle is preferably 30° to 70° for efficient removal of a re-deposited film on the side wall of the TMR element 40.

In the present invention, in the above state in which the grid 9 and the substrate 11 are parallel to each other, the inclination angle of the substrate 11 with respect to the grid 9 is 0°. Since the substrate 11 is symmetrical with respect to an in-plane center point of the substrate 11 and is rotated about the center point, when the substrate 11 is inclined at a predetermined angle from the inclination angle of 0°, the angle is equivalent in all inclination directions. Namely, when the substrate 11 is inclined by +30° from the inclination angle of 0° while defining a certain direction as + and a direction opposite to the certain direction as −, the inclination is equivalent to an inclination at −30°. Thus, in this specification, the angle is described as a positive value in principle.

The central normal line of the grid 9 refers to a line extending vertically from a center point of the grid 9 having a circular shape. The center point indicates a center of an effective region of the region of the grid 9, from which the ion beam 51 actually applied to the substrate 11 is extracted.

Typically, the center of the grid 9 substantially coincides with the center of the effective region. The substrate 11 is placed at a position where the central normal line of the substrate 11 crosses to the central normal line of the grid 9. When the grid 9 does not have a circular shape but has a regular hexagonal shape or a regular octagonal shape, for example, the center point is an intersection of a center obtained by connecting diagonal lines facing each other. When the grid 9 has a regular pentagonal shape or a regular heptagonal shape, the center point is an intersection of each perpendicular line from the apex toward the side facing the apex. When the substrate 11 is disposed while being shifted from the central normal line of the grid 9, the center point of the grid 9 is shifted in accordance with the shifted amount of the substrate 11.

In other words, the central normal line of the grid 9 according to the present invention is a segment along a travelling direction of the ion beam 51 extracted by the grid 9.

The center points of the grid 9 and the substrate 11 may have a slight difference in a range with less influence in the process for processing the substrate 11.

Preferential irradiation with the ion beam 51 from the directions 102a and 102b in which the pattern grooves 49 extend can reduce an influence of a shadow of an element constituting the pattern groove 49 when the pattern groove 49 is processed. This enables removal of the re-deposited film 50 while efficiently removing a portion of the re-deposited film 50 adhered to the side wall of the TMR element 40 and formed near a bottom portion of the pattern groove 49.

Figure 7:
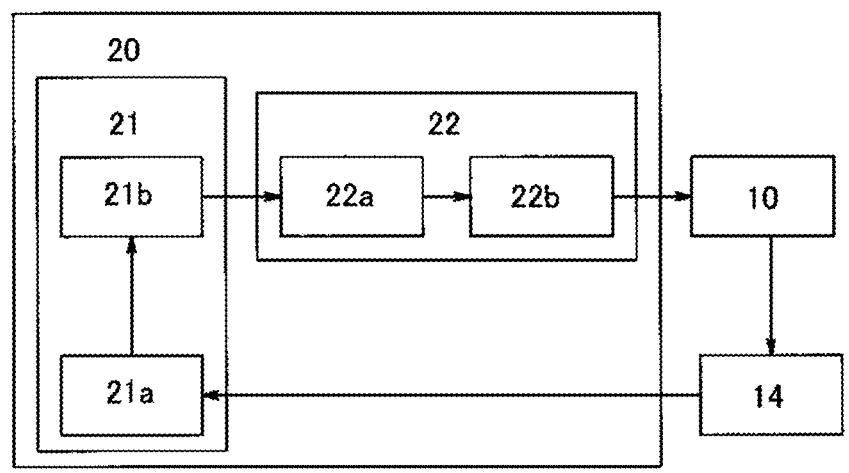
FIG. 7 is a block diagram showing a configuration of a controller according to a first embodiment of this invention.

Next, a controller 20 provided in the IBE apparatus 100 of this embodiment and controlling each of the above constituents will be described with reference to FIG. 7. FIG. 7 is a block diagram showing a configuration of the controller of this embodiment.

As shown in FIG. 7, the controller 20 of this embodiment is provided with a general computer and various drivers, for example. Namely, the controller 20 has a CPU (not shown) executing processing operations such as various calculations, controls, and discriminations, a ROM and an HDD (not shown) storing various control programs executed by the CPU, and the like. The controller 20 has a nonvolatile memory (not shown), such as a RAM, a flash memory, or an SRAM, for temporarily storing data and input data during processing operation executed by the CPU. In this configuration, the controller 20 executes IBE in accordance with a predetermined program stored in the ROM or the like or an instruction from a higher-level device. Various process conditions such as a discharge time, a discharge power, a voltage applied to the grid 9, a process pressure, and rotation and inclination of the substrate holder 10 are controlled in accordance with the instruction. It is possible to obtain output values of sensors such as a pressure gauge (not shown) for measuring a pressure in the IBE apparatus 100 and the position sensor 14 as position detecting means for detecting the rotation position of the substrate 11, and it is also possible to perform control according to the state of the apparatus.

The controller 20 includes a holder rotation control unit 21 as rotation control means for controlling the rotation speed of the substrate 11 in accordance with the rotation position detected by the position sensor 14. The holder rotation control unit 21 includes a target speed calculating section 21a and a drive signal generating section 21b and has a function of controlling the rotation of a rotating portion of the substrate holder 10 in accordance with the rotation position of the substrate 11 to control the rotation speed of the substrate 11 in accordance with a positional relationship between the rotation position of the substrate 11 and the incidence direction of the ion beam 51. The controller 20 is configured to receive information on the rotation position of the substrate 11 from the position sensor 14. When the controller 20 receives the information on the rotation position, the target speed calculating section 21a calculates a target rotation speed at the position using a value at the current rotation position of the substrate 11 output from the position sensor 14 for detecting the rotation position of the substrate 11. The value of the target rotation speed can be calculated by, for example, previously holding a correspondence relationship between the rotation position of the substrate 11 and the target rotation speed as a map. The drive signal generating section 21b generates a drive signal for achieving the target rotation speed, using the target rotation speed calculated by the target speed calculating section 21a and outputs the drive signal to a rotation drive mechanism 22. The controller 20 is configured to transmit the drive signal, generated by the drive signal generating section 21b, to the rotation drive mechanism 22.

In the example shown in FIG. 7, the rotation drive mechanism 22 includes a holder rotation driving section 22b, such as a motor driving the substrate holder 10, and a feedback controlling section 22a which determines an operation value of the holder rotation driving section 22b using a deviation between a target value and an actual value output from the position sensor 14 (the rotation position and the rotation speed) and drives the substrate holder 10 using a serve mechanism. However, the feedback controlling section 22a is not an essential component of the present invention and may be either a DC motor or an AC motor. The rotation drive mechanism 22 drives the holder rotation driving section 22b using the drive signal received from the controller 20 and rotates the substrate holder 10.

Next, a control of the IBE apparatus 100 according to this embodiment shown in FIG. 1 and an IBE method practiced using this apparatus will be described.

As a substrate to be processed by the IBE apparatus 100 according to this embodiment, a substrate as shown in FIG. 4 on which rectangular patterns arranged in rows and columns at fixed intervals in plan view are formed is provided, for example. The substrate 11 is placed on the substrate holder 10 in the processing space 1 through a substrate conveyance port 16 by conveyance means (not shown), for example a handling robot provided in a vacuum conveyance chamber adjacent to the apparatus. The substrate conveyance port 16 has a gate valve (not shown), and the gate valve has a structure isolating the processing space 1 from the vacuum conveyance chamber adjacent to the processing space 1 to prevent an atmosphere in the processing space 1 from mixing with an atmosphere in the vacuum conveyance chamber. In the placed substrate 11, the rotation start position of the substrate 11 is detected using a notch and an orientation flat. Alternatively, the rotation start position is read by reading an alignment mark on the substrate 11 with an optical camera or the like. The rotation start position may be detected before the placement of the substrate 11 on the substrate holder 10 or after the placement of the substrate 11 on the substrate holder 10. According to the results of detection of the rotation start position of the substrate 11, the rotation speed of the substrate 11 is controlled in accordance with the positional relationship between the grid 9 and the substrate 11 in the subsequent IBE.

Next, a rare gas such as Ar is introduced as a gas for discharge into the plasma generation portion 2 through the gas introduction portion 5. When reactive IBE is performed, an alcohol gas, a hydrocarbon gas, a carbon oxide gas, or the like is introduced into the plasma generation portion 2 together with the rare gas.

After that, a high frequency power is supplied from a power supply 12 for discharge, and discharge is performed by the plasma generation portion 2. A voltage is then applied to the grid 9, and ions are extracted by the plasma generation portion 2 to form the ion beam 51. The ion beam 51 extracted by the grid 9 is electrically neutralized by the neutralizer 13. The neutralized ion beam 51 is applied to the substrate 11 on the substrate holder 10, and IBE is performed. Alternatively, the neutralizer 13 emits electrons toward the substrate 11 to electrically neutralize the substrate 11.

After the substrate 11 is placed on the substrate holder 10, an ESC electrode is operated, whereby the substrate 11 is fixed by electrostatic adsorption. The substrate 11 placed on the substrate holder 10 is inclined to be better suited for removal of the re-deposited film 50 on the side wall of the TMR element 40, and the substrate 11 is inclined at 60° relative to the grid 9, for example. The inclination angle is determined to a predetermined angle by considering the shape and the size of the pattern on the substrate, the width of the pattern groove, and the like.

After the substrate holder 10 placing the substrate 11 is inclined relative to the grid 9, the substrate holder 10 starts to rotate in the in-plane direction of the substrate 11. The position sensor 14 detects the rotation position of the substrate 11, and in accordance with the rotation position detected by the position sensor 14, the rotation speed of the substrate 11 is controlled through the control by the holder rotation control unit 21 according to the detected rotation position.

Figure 8:
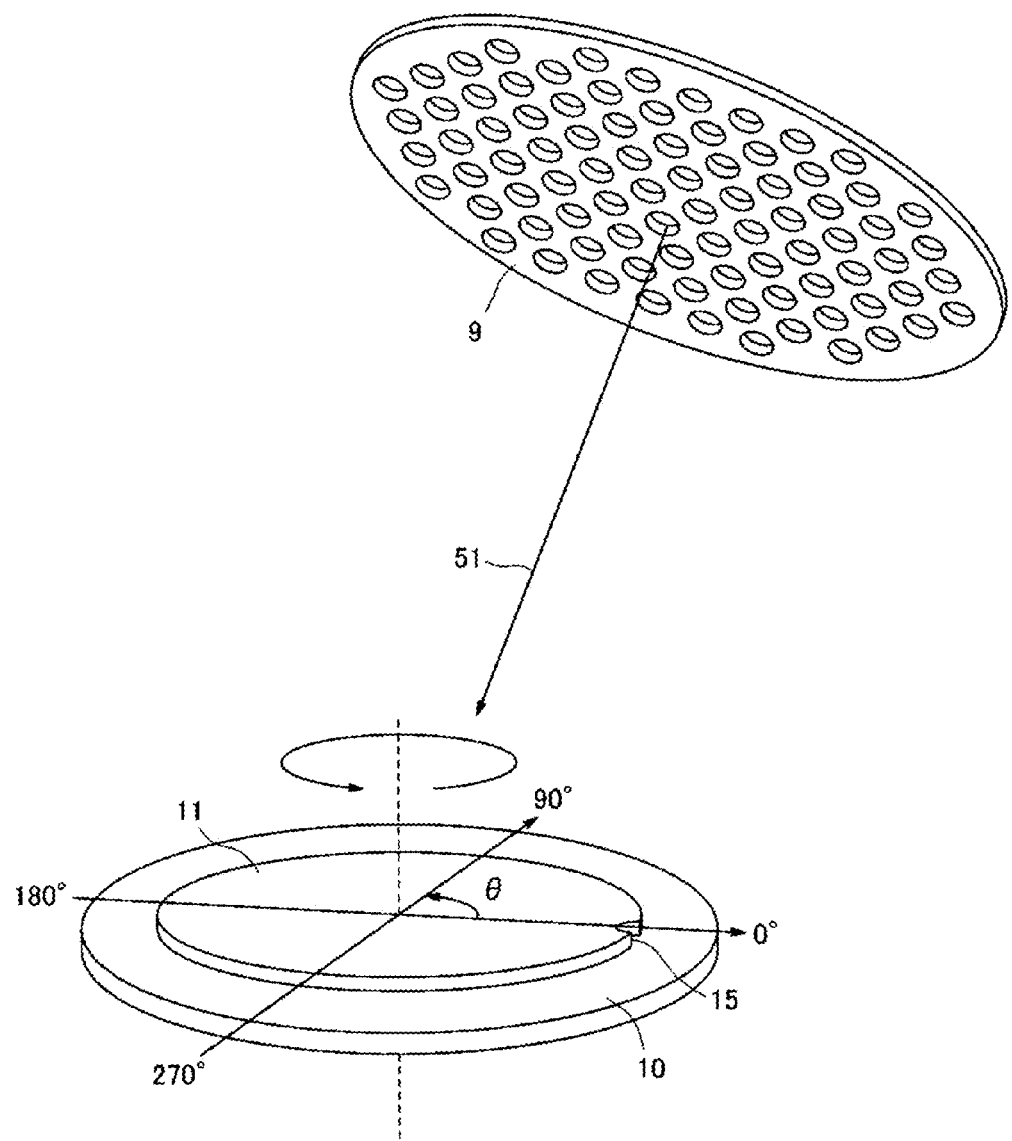
FIG. 8 is a perspective view for explaining a positional relationship between the grid of the IBE apparatus and the substrate and a phase of the substrate.
Figure 9:
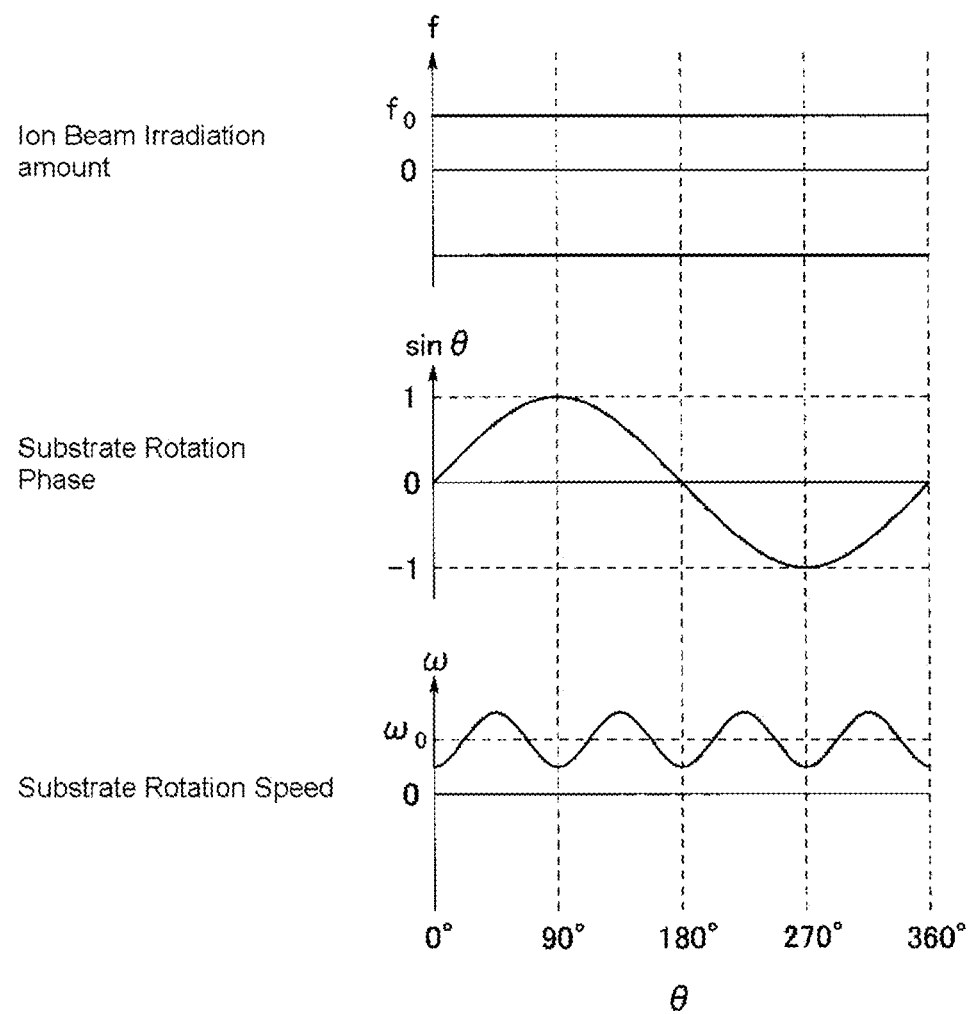
FIG. 9 is a view showing an ion beam irradiation amount, a substrate rotation phase, and a substrate rotation speed when the substrate is continuously rotated in the IBE process according to the first embodiment of this invention.
Figure 10:
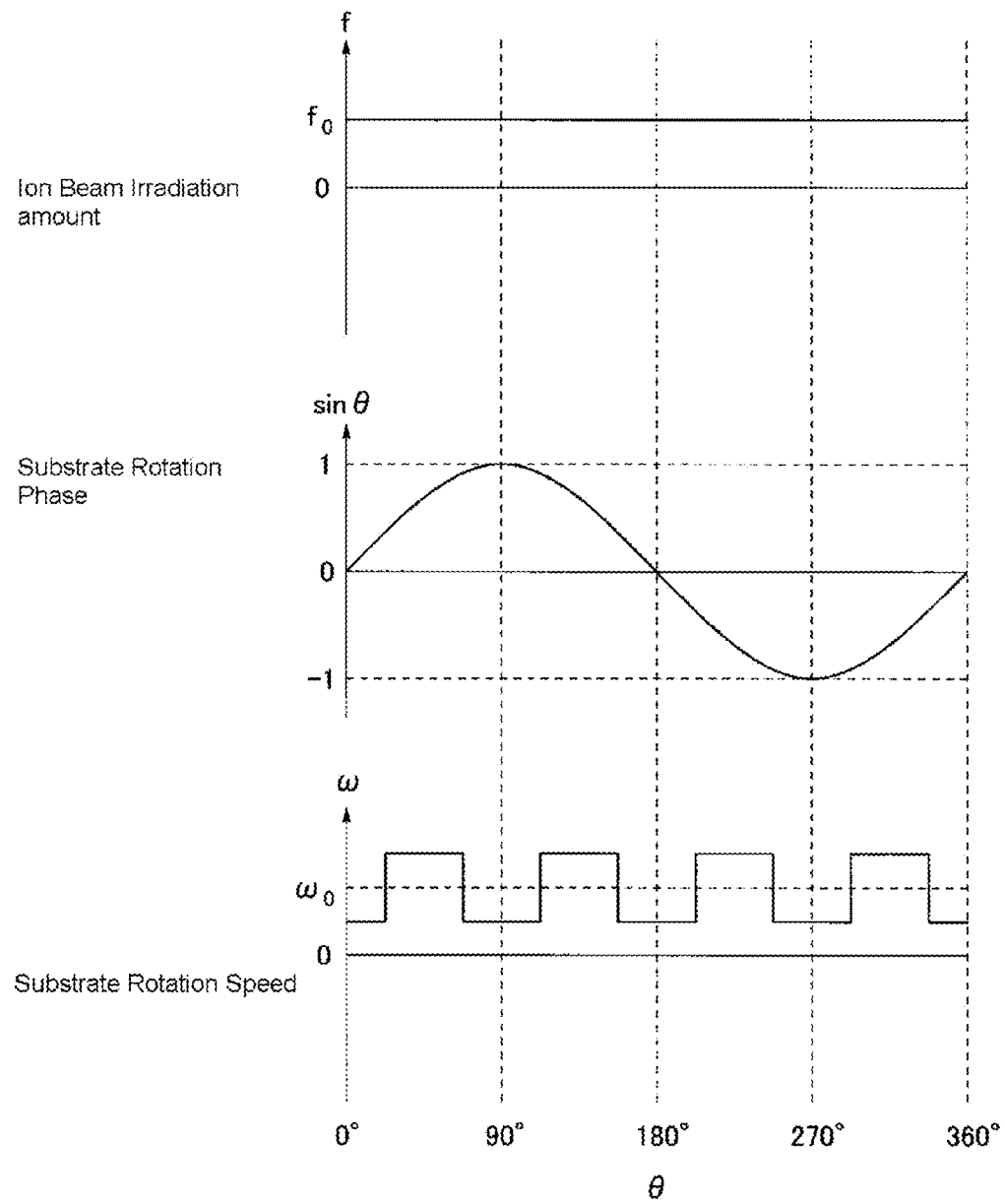
FIG. 10 is a view showing the ion beam irradiation amount, the substrate rotation phase, and the substrate rotation speed when the substrate is continuously rotated at two different rotation speeds in the IBE process according to the first embodiment of this invention.

Hereinafter, the control of the rotation speed of the substrate 11 will be described in more detail. FIG. 8 is a view for explaining the positional relationship between the grid 9 and the substrate 11 of this embodiment and a phase of the substrate 11. FIGS. 9 and 10 are explanatory views showing a control map of the rotation speed of the substrate in the IBE process according to this embodiment.

A rotation positional relationship between the grid 9 and the substrate 11 in this embodiment will be described using FIGS. 8 to 10. FIG. 8 is a schematic view showing a state in which the ion beam 51 is applied to the TMR element 40 formed on the substrate 11. The substrate 11 is placed on the rotatable substrate holder 10, and the substrate holder 10 is inclined relative to the grid 9 during the IBE process. In the present invention, as shown in FIG. 8, the rotation phase (rotational angle θ) of the substrate 11 is 0° when a notch 15 is a base point. A position opposite to the notch 15 across the center of the substrate 11 is defined as a position at 180°. Meanwhile, 90° and 270° are defined counterclockwise from 0°.

In an example of the IBE process using the apparatus according to this embodiment, as shown in FIG. 9 and the following formula (1), the rotation speed is controlled so that a rotation speed ω of the substrate 11 is a sine wave with respect to the rotation phase θ of the substrate 11.

$$\omega = A\sin(4(\theta-\alpha))+B \quad \text{Formula (1)}$$

$$A = a \times B \quad \text{Formula (2)}$$

Namely, the holder rotation control unit 21 as the rotation control means according to the present invention calculates the rotation speed ω as a quadruple cycle sine wave function of the rotation angle θ of the substrate 11, using the formula (1). Here, A represents an amplitude of the rotation speed and is obtained by multiplying a reference speed B by a fluctuation coefficient $\underline{a}$, as shown in the formula (2). α is a phase difference. An etching amount for each ion beam incidence angle in a substrate surface and distribution of a tapered angle can be optimized by changing the fluctuation coefficient $\underline{a}$ and the phase difference α. A range of the rotation phase of the substrate 11 is 0°≤θ<360°.

The example shown in FIG. 9 shows the substrate rotation speed ω with respect to the substrate rotation phase when the reference speed B is set to $\omega_0$, the fluctuation coefficient a is any numerical value not less than 0, and the phase difference α is 22.5°. This case means that the number of times of rotation of the substrate (rotation speed) is the smallest when the notch 15 of the substrate 11 is located at each of the positions at 0°, 90°, 180°, and 270°.

Here, the specific operations and effects obtained by a change in the rotation speed due to the rotation phase will be described.

In this embodiment, there will be considered a state in which the TMR elements 40 are arranged in a direction directed from 0° to 180° of the substrate 11 and a direction directed from 90° to 270° of the substrate 11.

In this embodiment, the rotation speed of the substrate 11 determined when the ion beam 51 enters the substrate 11 from the direction in which the pattern grooves 49 extend is reduced lower than those determined when the ion beams 51 enter from other directions.

More specifically, in the substrate rotation position with respect to the grid 9, when the segment obtained when the central normal line of the grid 9 is projected onto the surface of the substrate 11 is parallel to one direction in which the pattern grooves 49 extend, for example the direction directed from the position at 0° where the notch 15 is present to the position at 180°, the rotation speed of the substrate is reduced. Meanwhile, when the segment obtained when the central normal line of the grid 9 is projected onto the surface of the substrate 11 is parallel to the direction directed from 90° to 270°, that is, the other direction in which the pattern grooves 49 extend, the rotation speed is reduced.

As described above, the re-deposited film 50 can be efficiently removed by etching when the ion beam 51 enters from the direction in which the pattern grooves 49 extend. When the ion beam 51 enters from another direction, the TMR elements 40 adjacent to each other are shadowed by the re-deposited films 50, so that the re-deposited film 50 may not be efficiently removed. In this example, the rotation speed of the substrate 11 determined when the ion beam 51 enters from the direction in which the re-deposited film 50 can be efficiently removed by etching is reduced lower than the rotation speed of the substrate 11 determined when the ion beam 51 enters from another direction, whereby the energy amount of the ion beam 51 entering from the direction in which the removal by etching is efficiently performed is increased larger than the energy amounts of the ion beams 51 entering from other directions, so that the re-deposited film 50 can be removed with a lower energy in a shorter time than when the substrate 11 rotates at uniform speed.

The pattern grooves 49 extend in a plurality of directions, and when the etching amount of the re-deposited film 50 varies depending on the direction, the etching amounts in the individual directions may be more significantly different. For example, a shape of a bottom surface of the TMR element 40 formed on the substrate 11 has a long side in the direction directed from 0° to 180° and a short side in the direction directed from 90° to 270°, and when a side wall on the long-side side is more hardly etched than a side wall on the short-side side, the rotation speed of the substrate 11 determined when the ion beam 51 enters in the direction directed from 0° to 180° and the direction directed from 180° to 0° is reduced lower than the rotation speed of the substrate 11 determined when the ion beam 51 enters in the direction directed from 90° to 270° and the direction directed from 270° to 90°, whereby the etching amount can be adjusted.

In this embodiment, a control map shown in FIG. 9 may be previously stored in a memory such as a ROM of the controller 20 of FIG. 7. When the control map is thus previously stored in the memory, the target speed calculating section 21a which receives the information on the rotation position of the substrate 11 from the position sensor 14 refers to the control map of FIG. 9 stored in the memory to extract the rotation speed corresponding to the current rotation angle θ of the substrate 11, and, thus, to obtain the target rotation speed, whereby the target speed calculating section 21a outputs the obtained target rotation speed to the drive signal generating section 21b. Accordingly, the rotation angle θ of the substrate 11 is 0°, 90°, 180°, or 270°, and when the ion beam 51 enters from the direction in which the pattern grooves 49 extend, the rotation speed of the substrate 11 can be controlled to the lowest speed. Meanwhile, the rotation angle θ is 45°, 135°, 225°, or, 315°, and namely, when the ion beam 51 enters from the direction in which the pattern grooves 49 do not extend, the rotation speed of the substrate 11 can be controlled to the highest speed.

The rotation speed of the substrate holder 10 may not continuously change like the sine wave function shown in FIG. 9. For example, as shown in FIG. 10, a rotation speed change using two values may be applied. Namely, the rotation speed of the substrate 11 is determined as a first speed when the rotation angle θ of the substrate 11 is in ranges of 0° to 22.5°, 67.5° to 112.5°, 157.5° to 202.5°, 247.5° to 292.5°, and 337.5° to 360°, and meanwhile, when the rotation angle θ of the substrate 11 is in ranges of 22.5° to 67.5°, 112.5° to 157.5°, 202.5° to 247.5°, and 292.5° to 337.5°, the rotation speed of the substrate 11 is determined as a second speed higher than the first speed.

The rotation speed of the substrate 11 may be changed in a stepwise manner so that while the rotation speed is the lowest when the rotation angle θ of the substrate 11 is 0°, 90°, 180°, or 270°, the rotation speed of the substrate 11 is the highest when the rotation angle θ is 45°, 135°, 225°, and 315°.

Figure 11:
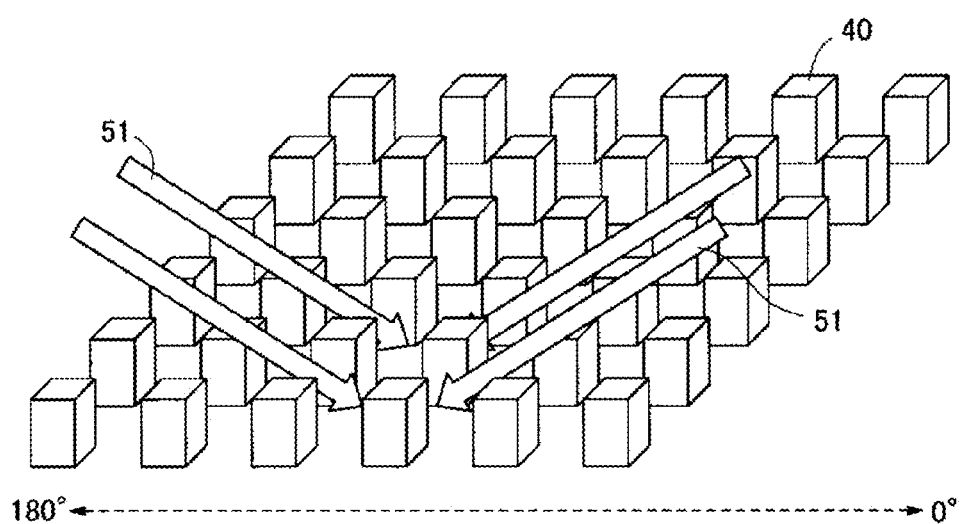
FIG. 11 is a perspective view showing an example of a state in which the ion beam enters from the direction in which the pattern grooves extend in this invention.

FIG. 11 shows an example of a state in which the ion beams 51 are applied from the direction in which the pattern grooves 49 extend. Among the arranged patterns, a pattern located at the outermost periphery is more easily etched than the inner pattern. A dummy pattern may be formed at the outermost periphery of the pattern to enhance uniformity of a pattern shape.

Second Embodiment

As described above, in the first embodiment, the rotation speed of the substrate holder 10 is controlled low so that the irradiation amount of the ion beam from the direction in which the pattern grooves 49 extend increases. However, the substrate holder 10 may be rotated continuously, or discontinuous pulse rotation may be adopted. In this embodiment, a mode of the discontinuous pulse rotation will be described FIG. 12 is an explanatory view when a rotation stop time in the substrate rotation is controlled in the discontinuous rotation of the substrate holder 10, according to this embodiment.

When the substrate holder 10 is rotated continuously, a holder rotation control unit 21 generates a drive signal such that the rotation speed of a substrate 11 is changed continuously, so that the rotation speed (angular speed ω) of the substrate 11 is modulated by four cycles while the substrate 11 rotates once (one cycle) in accordance with the formula (1), as shown in FIG. 9. Namely, the holder rotation control unit 21 controls the rotation of the substrate holder 10 so that the substrate 11 rotates continuously. In FIG. 9, $f_0$ represents a reference irradiation amount of the ion beam from a grid 9, and $ω_0$ represents a reference angular speed.

Figure 12:
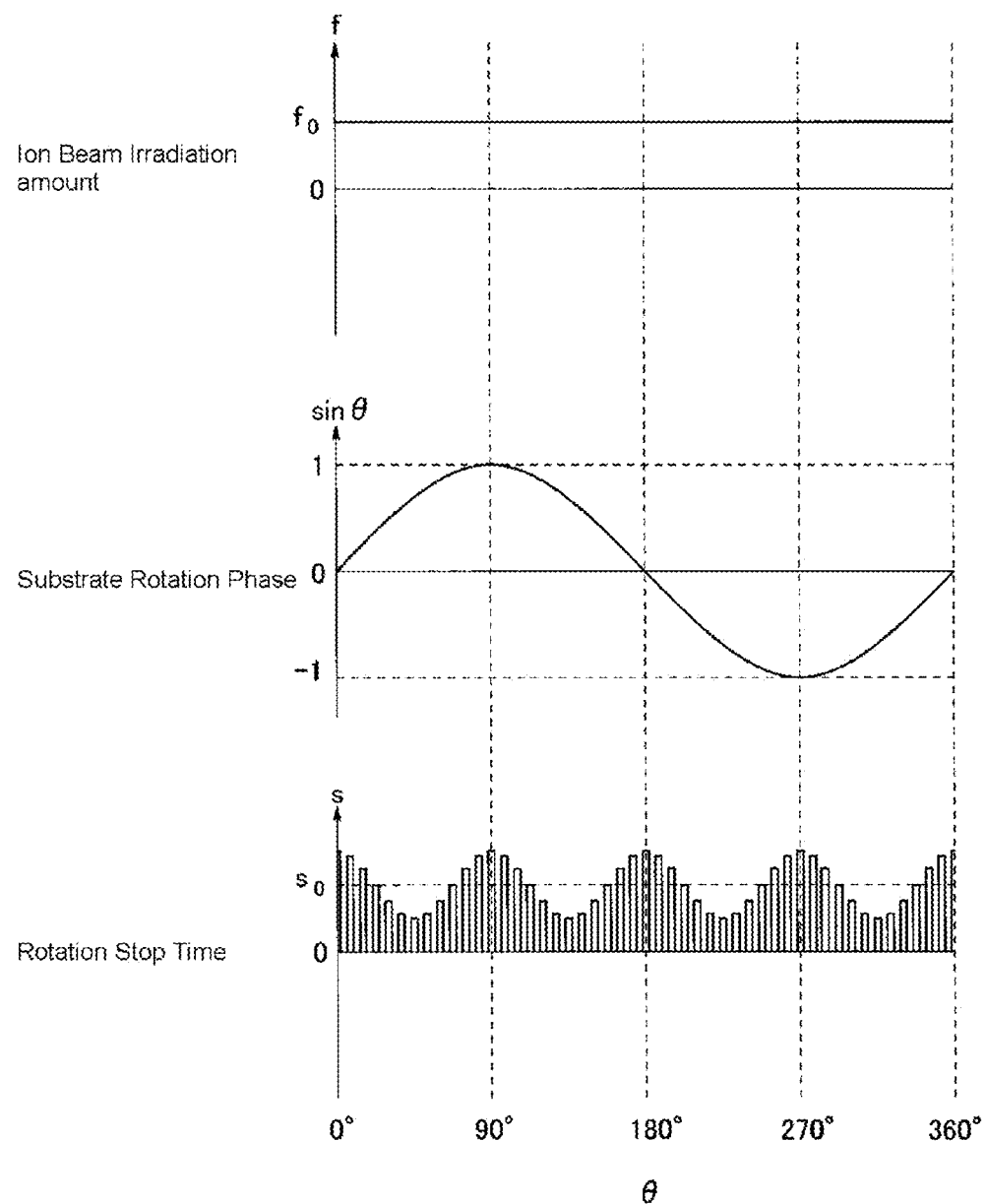
FIG. 12 is a view showing an ion beam irradiation amount, a substrate rotation phase, and a substrate rotation speed when a substrate is discontinuously rotated in an IBE process according to a second embodiment of this invention.

Meanwhile, when the substrate 11 (the substrate holder 10) is rotated discontinuously (in a clock mode), the holder rotation control unit 21 controls a rotation stop time s as shown in FIG. 12. Namely, for example, the holder rotation control unit 21 controls the rotation of the substrate holder 10 so that the substrate 11 stops its rotation at a plurality of predetermined rotation angles θ and a rotating portion of the substrate holder 10 rotates at a constant angular speed (rotation speed) at other rotation angles θ with the exception of the predetermined rotation angles θ. Under such control, the rotation speed of the substrate 11 is controlled so that the substrate 11 rotates discontinuously. The rotation speed of the rotating portion of the substrate holder 10 may be constant as described above or may be changed. When the vertical axis represents the rotation speed (angular speed ω) and the horizontal axis represents time t, the time during which the angular speed is 0 is referred to as the "rotation stop time s." Namely, the rotation stop time s refers to the time during which the rotation of the substrate holder 10 is stopped when the substrate holder 10 is rotated discontinuously. $s_0$ in FIG. 12 represents a reference rotation stop time.

As in the first embodiment, this embodiment has such essential features that the substrate 11 placed on the substrate holder 10 is located being inclined relative to the grid 9 and the irradiation amount of the ion beam from the direction the pattern grooves 49 extend is increased. As described above, the rotation stop time of the substrate 11 is increased when the substrate 11 is located so that the ion beam 51 enters from the direction the pattern grooves 49 extend, whereby effects similar to those of the first embodiment can be obtained. In this embodiment, the rotation stop time is sinusoidally modulated by four cycles to increase the rotation stop time when the ion beam 51 enters from the direction the pattern grooves 49 extend (when the rotation position of the substrate 11 is at 0°, 90°, 180°, or 270°) during one rotation of the substrate 11 (the substrate holder 10). Meanwhile, the rotation stop time of the substrate 11 is reduced when the ion beam 51 enters from the direction the pattern grooves 49 do not extend, whereby in the IBE process the energy amount of the ion beam 51 entering from the direction the pattern grooves 49 extend is increased larger than the energy amount of the ion beam 51 entering from the direction the pattern grooves 49 do not extend. When the etching amount of the pattern groove 49 differs between the long-side direction and the short-side direction, for example when such shape difference that while the depth of the pattern groove 49 on the long-side side is small, the depth of the pattern groove 49 on the short-side side is large occurs, the rotation stop time on the long-side side is further increased, and the ion beam irradiation amount is increased. Consequently, the depth of the pattern groove 49 is uniformed, so that processing can be performed such that a fine pattern has a uniform shape. In order to obtain good shape uniformity, it is preferable to equalize the rotation stop times at the rotation positions symmetrical with respect to the substrate 11 as a center (for example, 135° and 315°).

Third Embodiment

In the first and second embodiments, the mode in which the rotation speed of the substrate holder 10 is controlled has been described; however, in this embodiment, the amount of an ion beam applied to a substrate 11 is controlled by controlling the electrical power supplied from the power supply 12 for discharge of the IBE apparatus 100 shown in FIG. 1 to the RF antenna 6, whereby a re-deposited film 50 on a side wall of a TMR element 40 is removed. In an IBE process, the ion beam irradiation amount is related to a plasma density of a plasma formed by a plasma generation portion 2. Accordingly, the plasma density of the plasma generation portion 2 can be changed by changing the electrical power supplied to the RF antenna 6. Consequently, the ion beam irradiation amount can be changed according to the rotation phase of the substrate 11.

As in the first embodiment, this embodiment has such essential features that the substrate 11 placed on the substrate holder 10 is located being inclined relative to the grid 9 and, in the IBE process, the energy amount of the ion beam 51 entering the substrate 11 from the direction in which the pattern grooves 49 extend is increased larger than the energy amounts of the ion beams 51 entering the substrate 11 from other directions.

Figure 13:
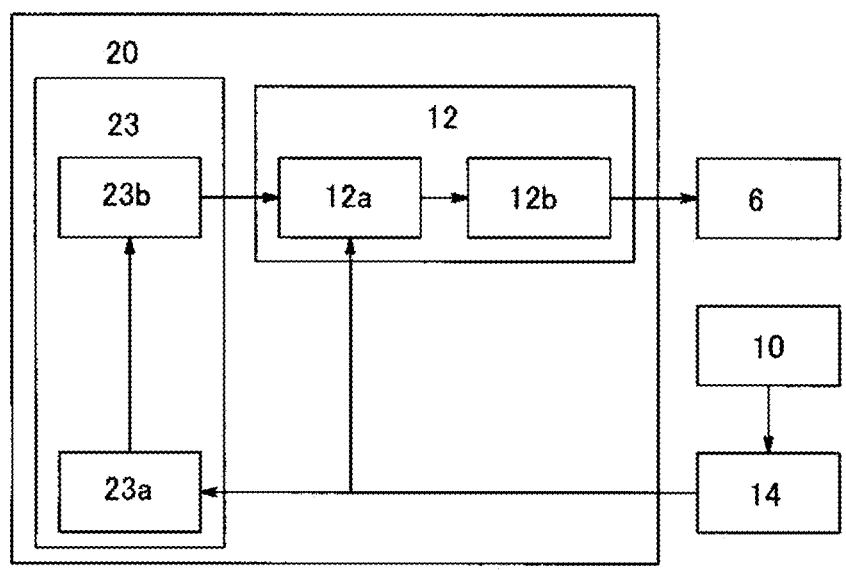
FIG. 13 is a block diagram showing a configuration of a controller according to a third embodiment of this invention.

FIG. 13 is a block diagram of a controller 20 according to this embodiment. In this embodiment, the controller 20 includes a power control unit 23 as electrical power control means for controlling a power (electrical power) supplied to plasma generation means in accordance with a rotation position detected by a position sensor 14. The power control unit 23 includes a target power calculating section 23a and an output signal generating section 23b and has a function of controlling a power (electrical power) supplied to plasma generation means in accordance with a positional relationship between the rotation position of the substrate 11 and the incidence direction of the ion beam 51.

The controller 20 is configured to receive information on the rotation position of the substrate holder 10 from the position sensor 14. When the controller 20 receives the information on the rotation position, the target power calculating section 23a calculates a target power (target electrical power) at the position, using a value at the current rotation position of the substrate holder 10 input from the position sensor 14 for detecting the rotation position of the substrate holder 10. The value of the target power can be calculated by, for example, previously holding a correspondence relationship between the rotation position of the substrate holder 10 and the target power as a map in a memory of the controller 20 or the like. The output signal generating section 23b generates an output signal for achieving the target power, using the target power calculated by the target power calculating section 23a and outputs the output signal to the power supply 12 for discharge. The controller 20 is configured to transmit the output signal, generated by the output signal generating section 23b, to the power supply 12.

In the example shown in FIG. 13, the power supply 12 includes a power output section 12b supplying the electrical power to the RF antenna 6 as plasma generation means and a feedback control section 12a which determines an operation value of the power output section 12b using a deviation between a target value and an actual value output from the position sensor 14 (the rotation position and the rotation speed). However, the feedback control section 12a is not an essential component according to the present invention.

Also in this embodiment, as in the first embodiment, the substrate holder 10 may be rotated continuously, or discontinuous pulse rotation may be adopted.

Figure 14:
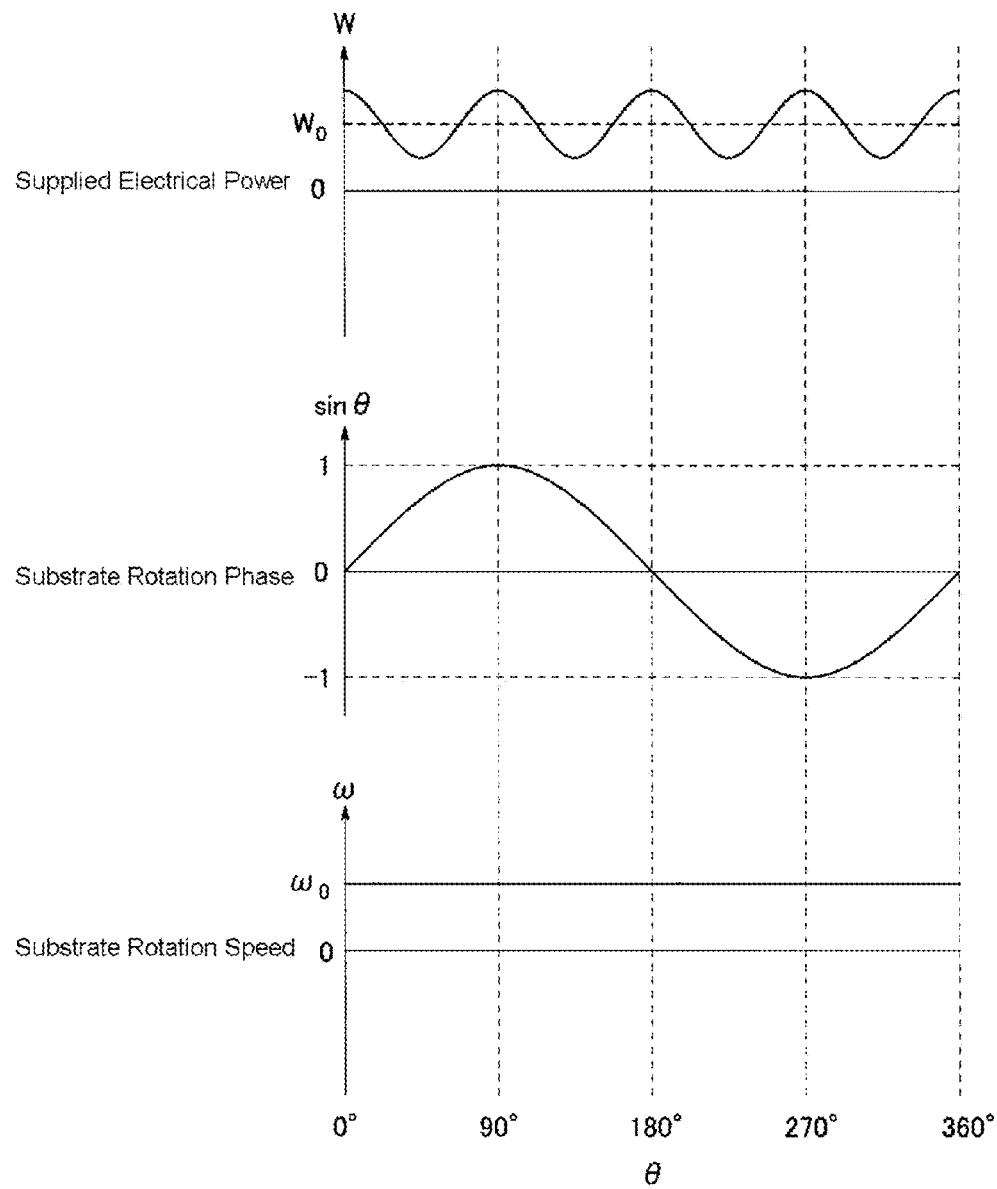
FIG. 14 is a view showing an electrical power supplied to an RF antenna, a substrate rotation phase, and a substrate rotation speed when a substrate is continuously rotated at uniform speed in an IBE process according to the third embodiment of this invention.
Figure 15:
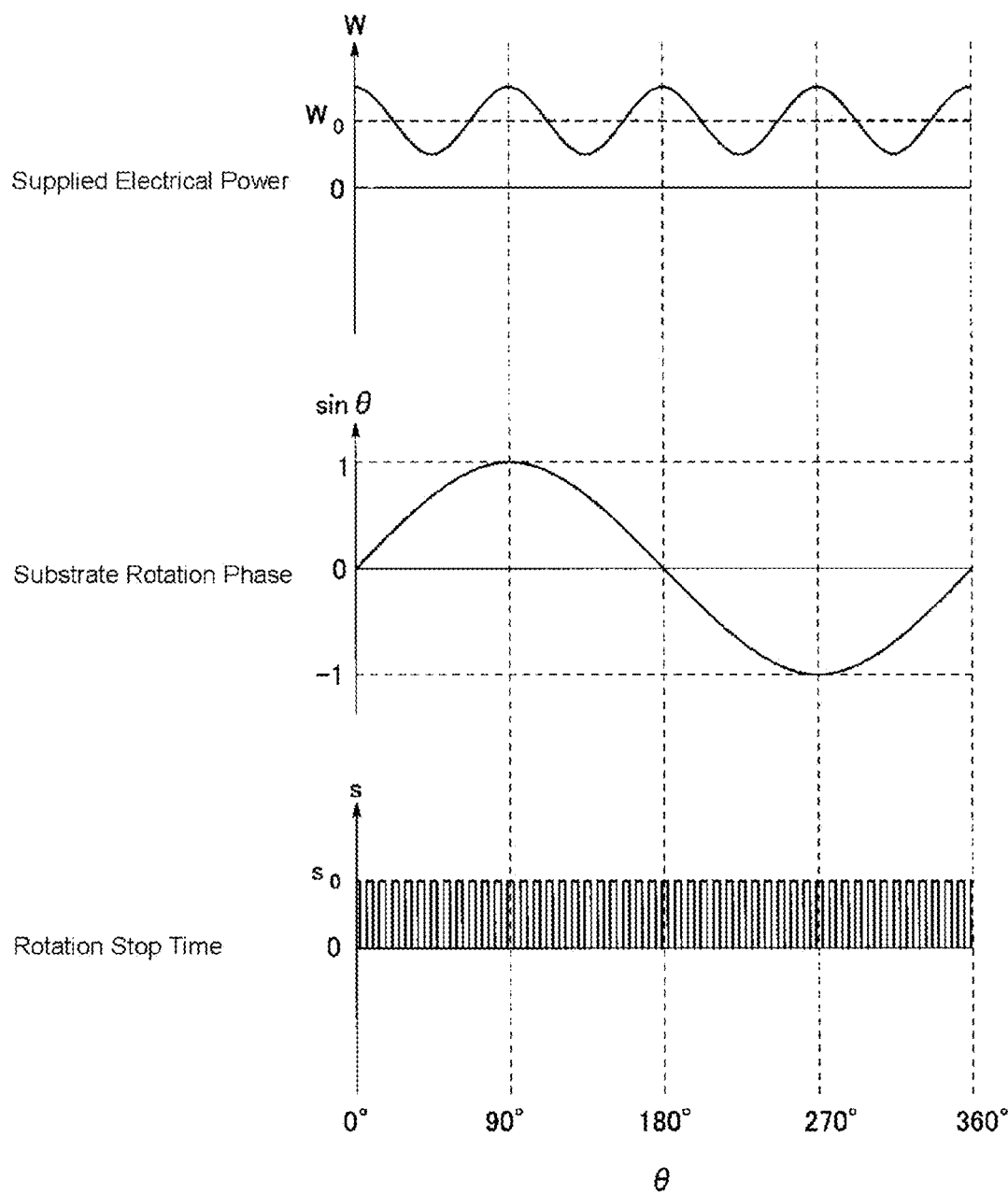
FIG. 15 is a view showing the electrical power supplied to the RF antenna, the substrate rotation phase, and a rotation stop time when the substrate is discontinuously rotated in the IBE process according to the third embodiment of this invention.

FIG. 14 shows a control map of the rotation speed of the substrate 11 when the substrate 11 (the substrate holder 10) is rotated in the controlling of the electrical power supplied to the plasma generation means, according to this embodiment. FIG. 15 is an explanatory view when the substrate 11 (the substrate holder 10) is discontinuously rotated in the controlling of the electrical power supplied to the plasma generation means, according to this embodiment. When the substrate 11 is rotated discontinuously, a constant electrical power is supplied to the plasma generation means, and the rotation stop time is changed, whereby the ion beam irradiation amount may be controlled in accordance with the rotation angle θ.

In the embodiment according to FIG. 14, the power control unit 23 can calculate a power for discharge according to the rotation angle θ of the substrate 11, using the quadruple cycle sine wave function as in the formula (1). Namely, the power control unit 23 generates an output signal to modulate the electrical power, supplied to the plasma generation means, by four cycles during one rotation of the substrate 11 (the substrate holder 10). At this time, the electrical power supplied to the plasma generation means may be changed smoothly continuously or may be changed in a stepwise manner with an allowance. As shown in FIGS. 14 and 15, the he power control unit 23 may control the power supply 12 for discharge so that the amount of the ion beam applied to the substrate 11 is maximized by setting, to a maximum value, the power (electrical power) supplied when the rotation angle θ determined when the ion beam 51 enters from the direction in which the pattern grooves 49 extend is 0°, 90°, 180°, or 270°, and the amount of the ion beam applied to the substrate 11 is reduced by reducing the power at angles other than these rotation angles.

As described above, this embodiment can obtain the effects of the present invention by locating the substrate 11, placed on the substrate holder 10, while inclining the substrate 11 relative to the grid 9 and by controlling the electrical power supplied to the RF antenna 6 so that the ion beam irradiation amount from the direction in which the pattern grooves 49 extend increases. In order to obtain good shape uniformity, it is preferable to equalize the applied voltages at the rotation positions symmetrical with respect to the substrate 11 as a center (for example, 135° and 315°).

Fourth Embodiment

In the third embodiment, there has been described the method of controlling the electrical power supplied to the RF antenna 6, which is the plasma generation means, to efficiently remove the re-deposited film 50 on the side wall of the TMR element 40. However, in this embodiment, the re-deposited film 50 is removed by changing a beam extraction voltage. In the IBE process, ions of the plasma generation portion 2 are extracted to form a beam by a voltage applied to the grid 9 after the formation of the plasma in the plasma generation portion 2. Since the energy amount of the ion beam 51 extracted from the plasma generation portion 2 depends on the beam extraction voltage, a groove of a fine pattern is processed by changing the voltage in accordance with the rotation phase of the substrate 11.

Hereinafter, the beam extraction voltage in this embodiment will be described using FIG. 1.

Typically, each potential of the substrate holder 10 and a third electrode 9c is ground potential. Thus, the energy amount of each ion in the ion beam is determined by a positive voltage applied to the first electrode 9a. Accordingly, in this embodiment, the voltage applied to the first electrode 9a is the beam extraction voltage. Hereinafter, an embodiment in which the beam extraction voltage is changed by changing the voltage applied to the first electrode 9a will be described.

As in the first embodiment, this embodiment has such essential features that the beam extraction voltage is changed to increase, in the IBE process, the energy amount of the ion beam 51 entering the substrate 11 from the direction in which the pattern grooves 49 extend larger than the energy amounts of the ion beams 51 entering the substrate from other directions.

Figure 16:
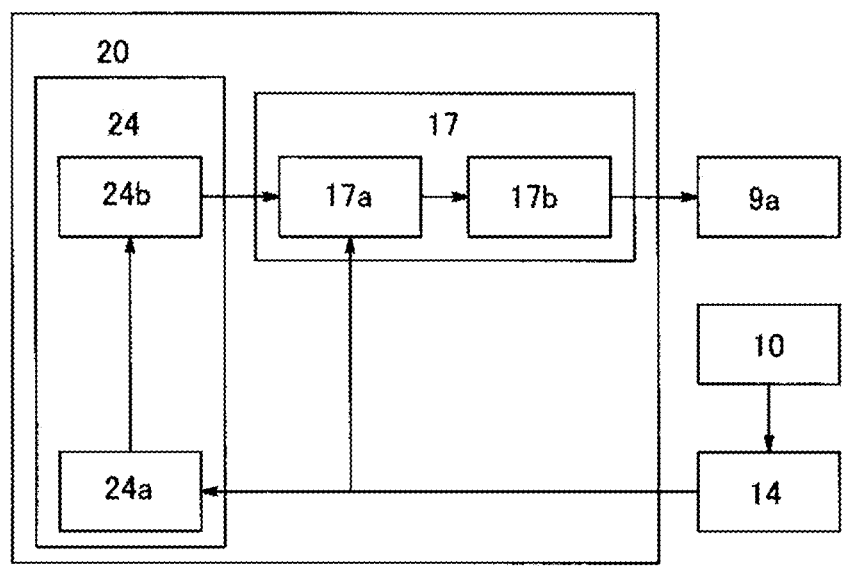
FIG. 16 is a block diagram showing a configuration of a controller according to a fourth embodiment of this invention.

FIG. 16 is a block diagram of a controller 20 according to this embodiment. In this embodiment, the controller 20 includes an applied voltage control unit 24 as voltage control means for controlling the voltage (beam extraction voltage)

applied to the first electrode 9a in accordance with a rotation position detected by a position sensor 14. The applied voltage control unit 24 includes a target voltage calculating section 24a and an output signal generating section 24b and has a function of controlling the voltage applied to the first electrode 9a in accordance with a positional relationship between the rotation phase of the substrate 11 and the incidence direction of the ion beam 51.

The controller 20 is configured to receive information on the rotation position of the substrate holder 10 from the position sensor 14. When the controller 20 receives the information on the rotation position, the target voltage calculating section 24a calculates a target voltage at the position, using a value of the current rotation phase of the substrate holder 10 input from the position sensor 14 for detecting the rotation phase of the substrate holder 10. The value of the target voltage can be calculated by, for example, previously holding a correspondence relationship between the rotation position of the substrate holder 10 and the target voltage as a map in a memory of the controller 20 or the like. The output signal generating section 24b generates an output signal for achieving the target voltage, using the target power calculated by the target voltage calculating section 24a and outputs the output signal to a power supply 17 for the first electrode. The controller 20 is configured to transmit the output signal, generated by the output signal generating section 24b, to the power supply 17 for the first electrode.

In the example shown in FIG. 16, the power supply 17 for the first electrode includes an applied voltage output section 17b applying the voltage to the first electrode 9a and a feedback control section 17a which determines an operation value of the applied voltage output section 17b using a deviation between a target value and an actual value (the rotation position or the rotation speed) output from the position sensor 14. However, the feedback control section 17a is not an essential component according to the present invention.

Also in this embodiment, the substrate holder 10 may be rotated continuously as in the first embodiment, or discontinuous pulse rotation may be adopted as in the second embodiment.

Figure 17:
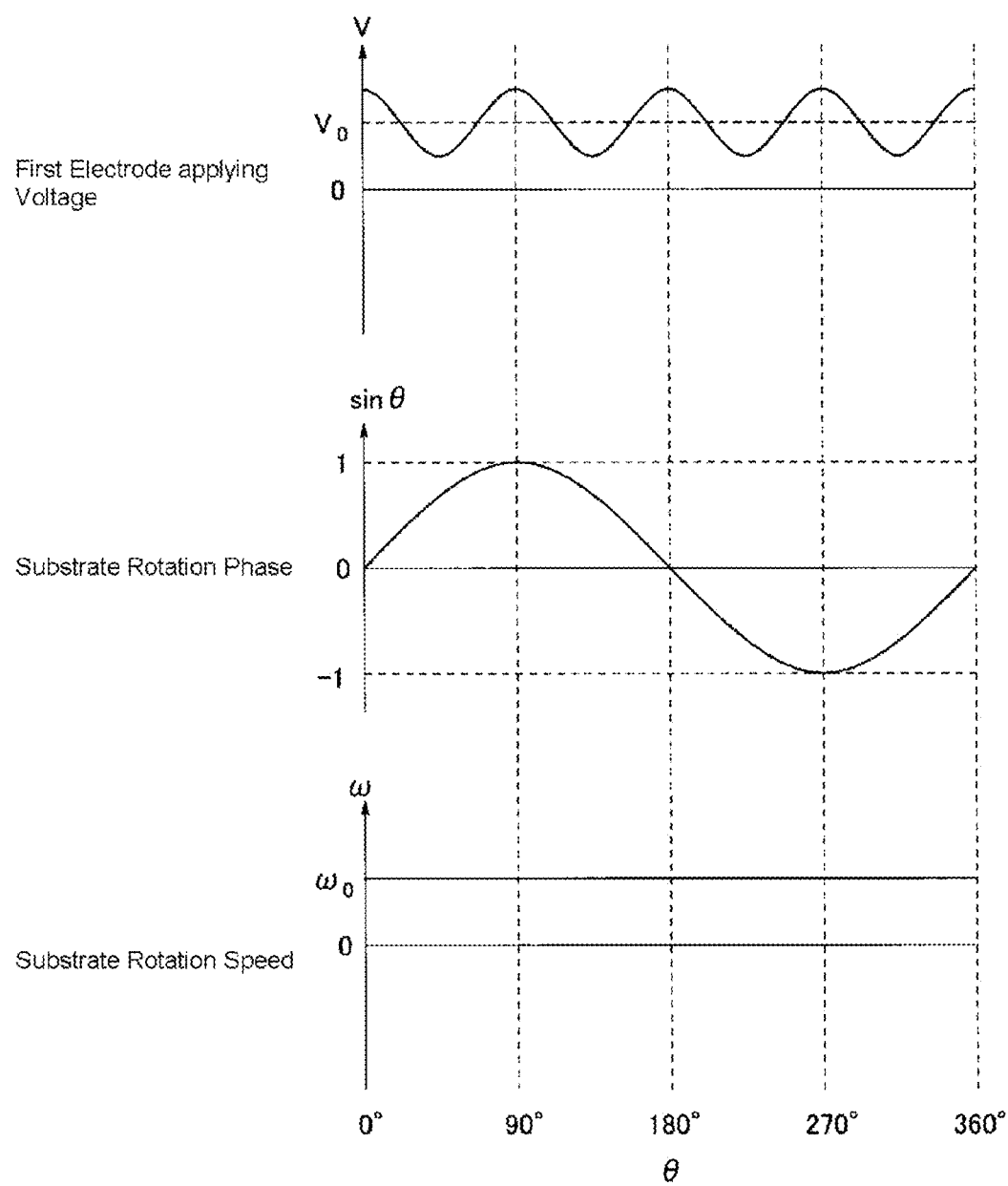
FIG. 17 is a view showing a voltage applied to a first electrode, a substrate rotation phase, and a substrate rotation speed when a substrate is continuously rotated at uniform speed in an IBE process according to the fourth embodiment of this invention.
Figure 18:
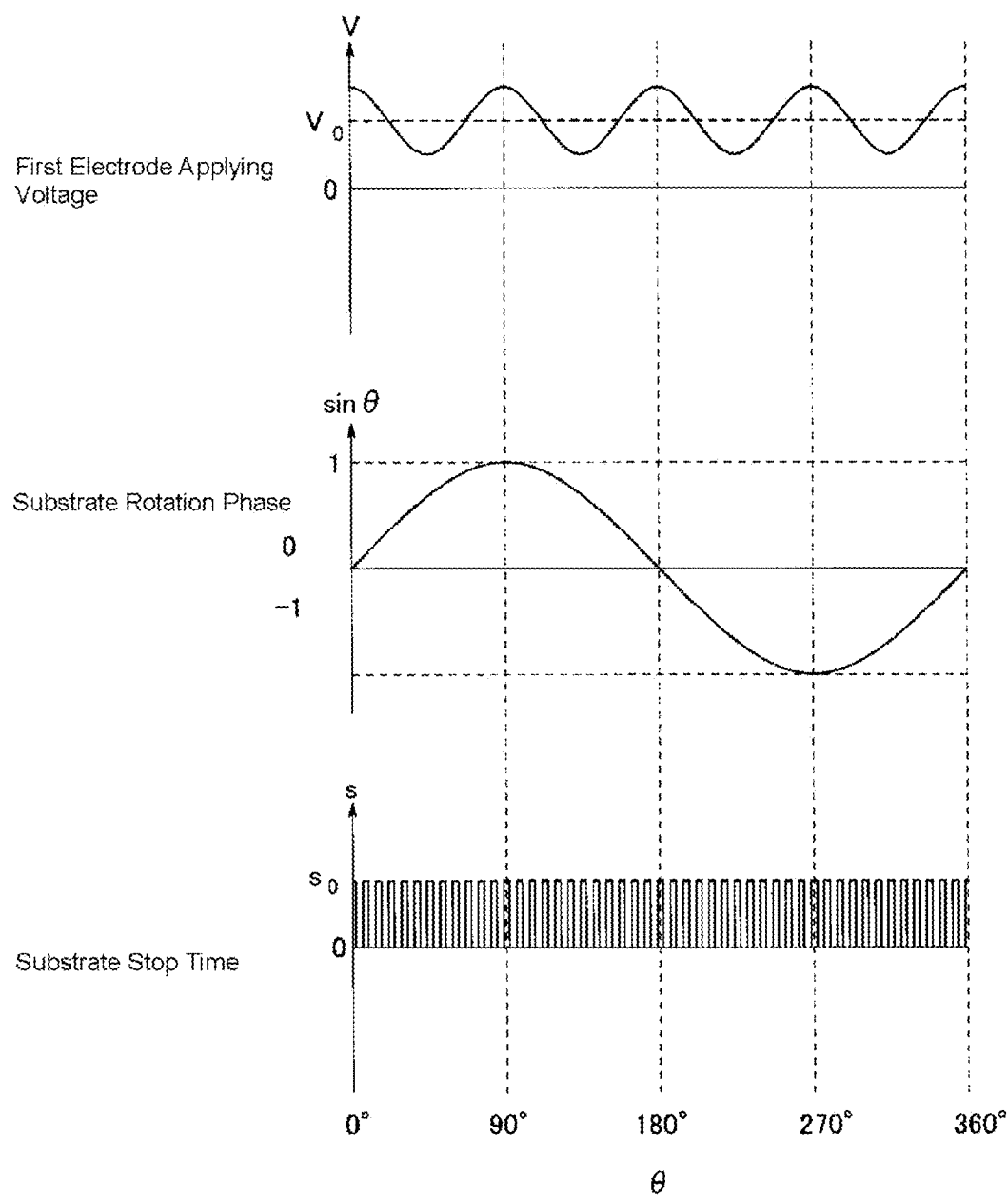
FIG. 18 is a view showing the voltage applied to the first electrode, the substrate rotation phase, and a rotation stop time when the substrate is discontinuously rotated in the IBE process according to the fourth embodiment of this invention.

FIG. 17 is an explanatory view when the substrate 11 (the substrate holder 10) is continuously rotated at uniform speed in the controlling of the beam extraction voltage (that is, the voltage applied to the first electrode 9a), according to this embodiment. FIG. 18 is an explanatory view when the substrate 11 (the substrate holder 10) is discontinuously rotated in the controlling of the beam extraction voltage (that is, the voltage applied to the first electrode 9a), according to this embodiment. When the substrate is rotated discontinuously, a constant voltage is applied to the first electrode 9a, and the ion beam irradiation amount may be controlled in accordance with the rotation angle θ by changing the rotation stop time.

In the embodiment according to FIGS. 17 and 18, the applied voltage control unit 24 can calculate an applied voltage according to the rotation angle θ of the substrate 11, using the quadruple cycle sine wave function as in the formula (1). Namely, the applied voltage control unit 24 generates an output signal to modulate the beam extraction voltage by four cycles during one rotation (one cycle) of the substrate 11 (the substrate holder 10). At this time, the beam extraction voltage may be changed smoothly continuously or may be changed in a stepwise manner with an allowance. For example, in the applied voltage control unit 24, as shown in FIGS. 17 and 18, the energy amount of the ion beam 51 is maximized by setting, to a maximum value, the voltage applied to the first electrode 9a when the rotation angle θ is 0°, 90°, 180°, or 270° as a first state, and the amount of the ion beam applied from the direction in which the pattern grooves 49 extend increases. The power supply 17 for the first electrode may be controlled so that the energy amount of the ion beam 51 is reduced by reducing a voltage determined when the ion beam 51 enters from the direction in which the pattern grooves 49 do not extend. When the energy amount of the ion beam 51 is reduced, the voltage applied to the first electrode 9a is set to zero, and the application of the ion beam 51 to the substrate 11 may be stopped.

As described above, this embodiment can obtain the effects of the present invention by locating the substrate 11, placed on the substrate holder 10, while inclining the substrate 11 relative to the grid 9 and by controlling the applied voltage from the power supply 17 for the first electrode by the applied voltage control unit 24 so that the ion beam irradiation amount from the direction in which the pattern grooves 49 extend increases. In order to obtain good shape uniformity, it is preferable to equalize the supplied electrical powers at the rotation positions symmetrical with respect to the substrate 11 as a center (for example, 135° and 315°).

Although in this embodiment the beam extraction voltage is changed by changing the voltage applied to the first electrode 9a, the beam extraction voltage may be changed by other methods. For example, a positive voltage lower than that of the first electrode 9a is applied to the third electrode 9c, and the beam extraction voltage may be changed by changing the voltage applied to the third electrode 9c. The energy amount determined when the ion beam 51 enters the substrate 11 may be changed by changing the voltage applied to the substrate holder 10.

In this embodiment, the grid 9 may not necessarily be constituted of three sheets of electrodes. This is because, as described above, the essence of the present invention is that the energy amount of the ion beam 51 is changed in accordance with the rotation phase of the substrate 11.

Hereinabove, the embodiments of the present invention can be variously modified without departing from the scope of claims.

Figure 19A:
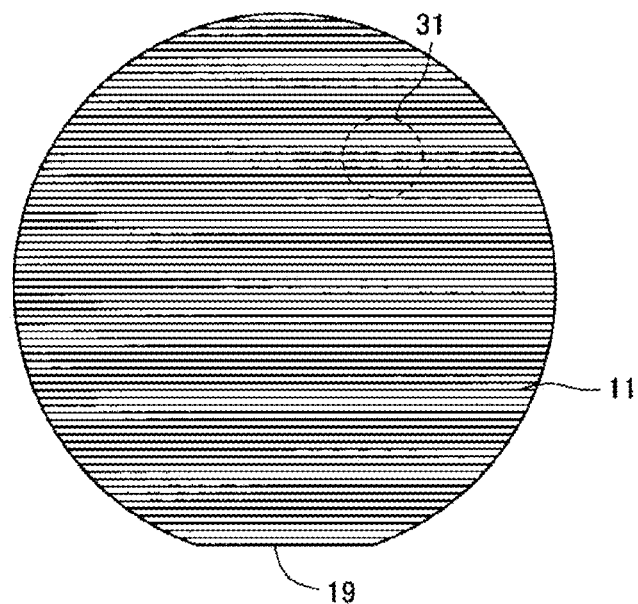
FIGS. 19A to 19C are schematic views showing a surface shape of a substrate to which this invention is applicable.
Figure 19B:
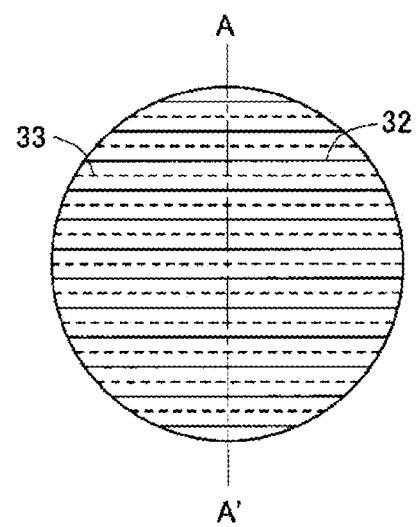
Figure 19C:
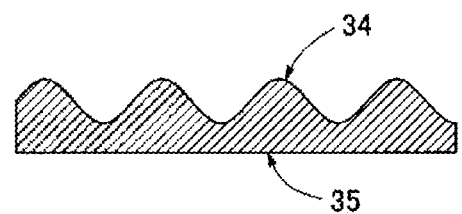
Figure 20A:
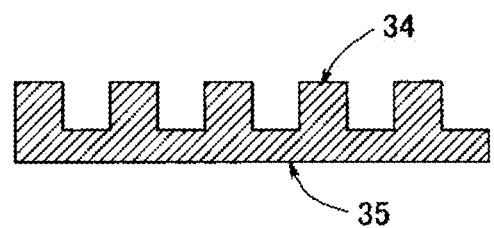
FIGS. 20A to 20c are schematic cross-sectional views of a surface shape of a substrate to which this invention is applicable.
Figure 20B:
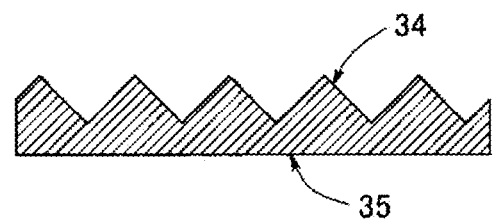
Figure 20C:
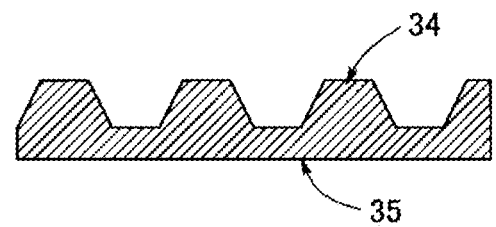

In the present invention, the TMR elements 40 formed on the substrate 11 may not be arranged so that the pattern grooves 49 is perpendicular to each other while both horizontal and vertical ends of the exemplified rectangular-shaped pattern are aligned but may be arranged to have a line-and-space shape as shown in FIGS. 19A and 19B. FIG. 19B is an enlarged view of a region 31 in FIG. 19A. FIG. 19C is an A-A' cross-sectional view of FIG. 19B. In FIGS. 19A to 19C, reference numeral 19 is an orientation flat, reference numeral 32 is a ridge line, and reference numeral 33 is a valley line. The valley line 33 corresponds to the pattern groove 49 according to this invention. Further, in FIGS. 19A to 19C, reference numeral 34 is a front surface of the substrate 11, and reference numeral 35 is a rear surface. A cross-sectional shape on the front surface of the substrate 11 to which this invention is applied may be a sinusoidal waveform shape shown in FIG. 19C, a rectangular waveform shape shown in FIG. 20A, a triangular waveform shape shown in FIG. 20B, or a trapezoidal waveform shape shown in FIG. 20C. According to the invention, when the invention is used in the substrate 11 after the formation of the pattern groove 49, there-deposited film on the side wall of the pattern can be removed efficiently.

Figure 21:
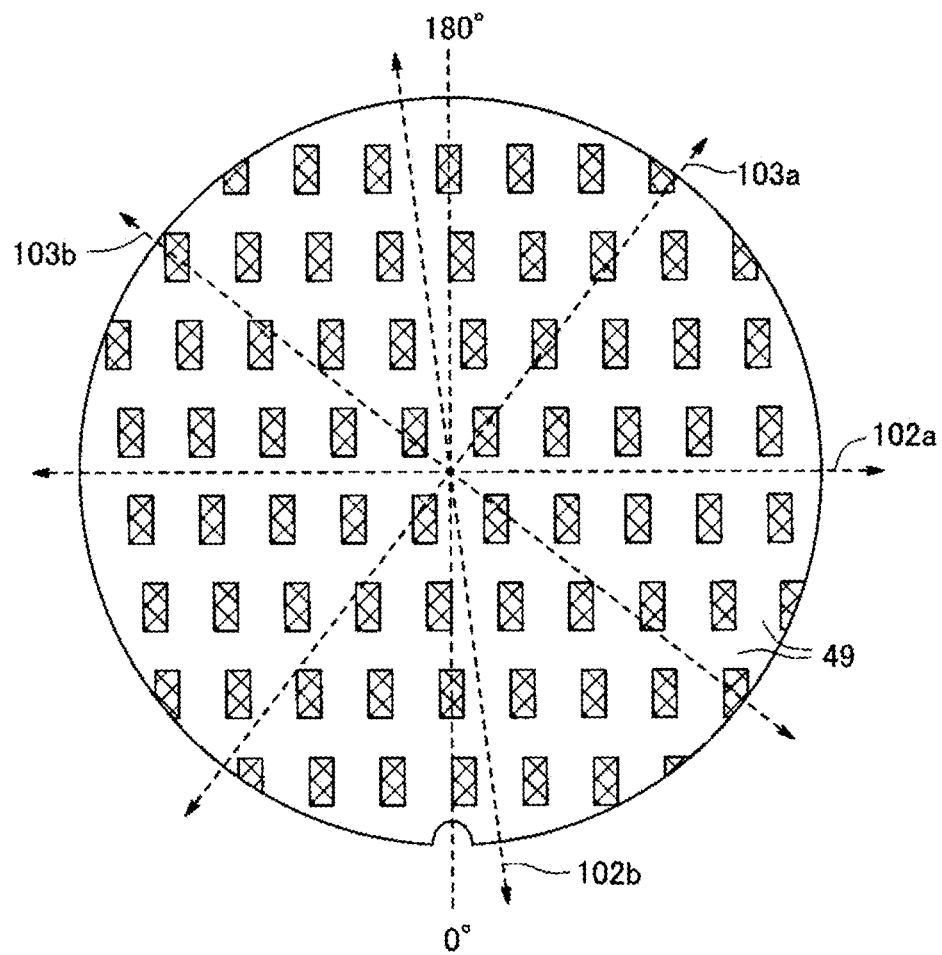
FIG. 21 is a view showing alignment of TMR elements on the substrate to which this invention is applicable and a direction in which pattern grooves extend.

As shown in FIG. 21, the present invention is applicable to a case in which rectangular-shaped pattern are arranged in an oblique direction. In this case, as shown in FIG. 21, directions 102a and 102b in which the pattern grooves 49 extend obliquely cross to each other.

The present invention is available for not only the exemplified TMR element for MRAM but also various devices such as a magnetic head for HDD, a magnetic recording medium for HDD, a magnetic sensor, a light emitting device, a piezoelectric device, a phase-change element, and a resistance change element. This is because after a predetermined pattern is formed in such a device, a re-deposited film adhered to a side wall of the pattern can be efficiently removed with the ion beam 51 from a direction along the pattern groove.

The essence of each of the above embodiments according to the present invention is that IBE is performed so that the energy amount of the ion beam 51 entering from the direction in which the pattern grooves 49 formed on the substrate 11 extend is increased larger than the energy amounts of the ion beams 51 entering from other directions. The energy amount of the ion beam 51 entering from each direction can be changed by using each of the above embodiments.

Fifth Embodiment

In this embodiment, an inclination angle of a substrate 11 with respect to a grid 9 is changed in accordance with the rotation speed of the substrate 11 in the first embodiment. The details of this embodiment will be hereinafter described using FIG. 22.

Figure 22:
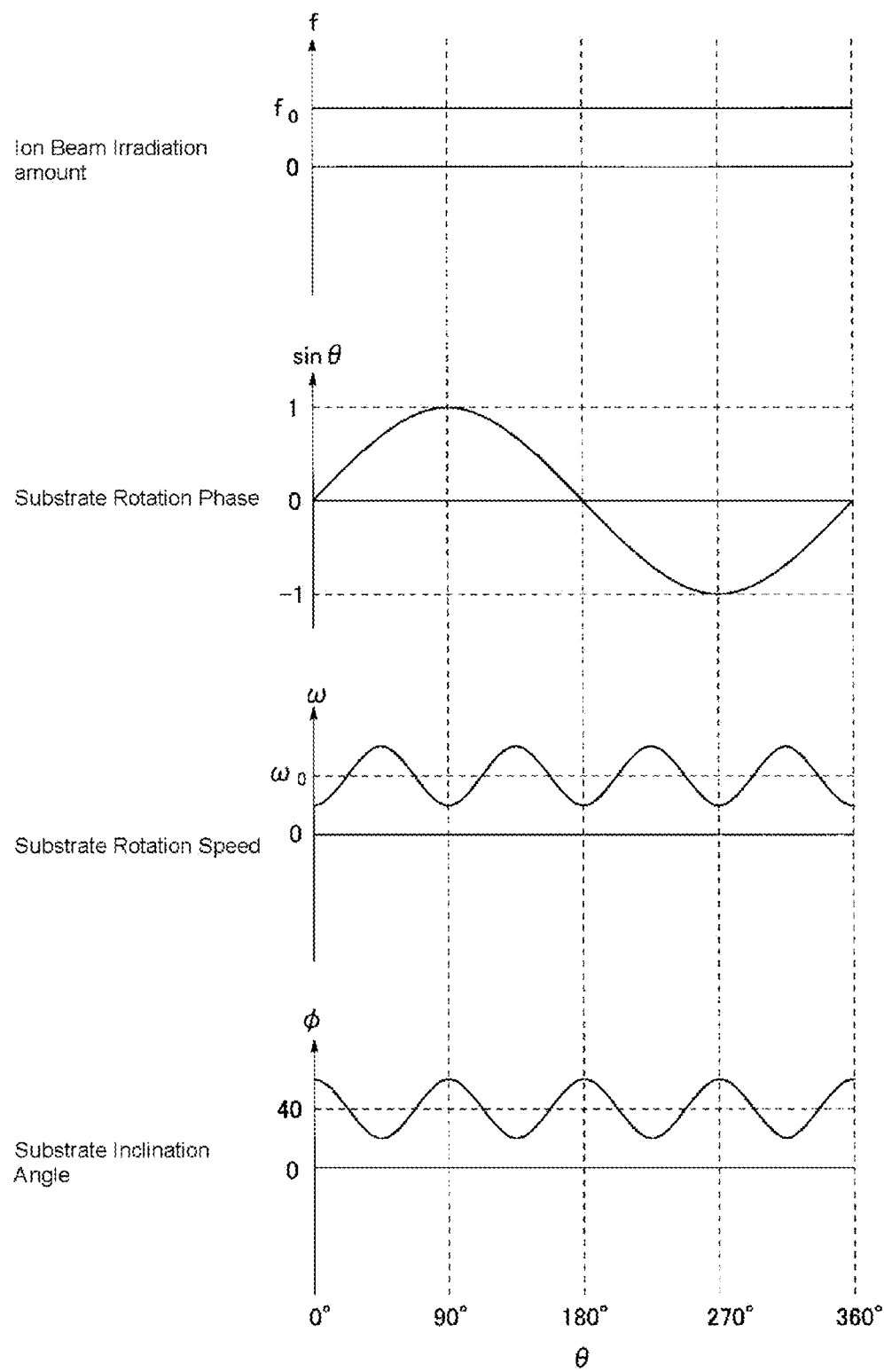
FIG. 22 is a view showing an ion beam irradiation amount, a substrate rotation phase, a substrate rotation speed, and a substrate inclination angle when a substrate is continuously rotated in an IBE process according to a fifth embodiment of this invention.

FIG. 22 shows a state in which the rotation speed of the substrate 11 changes in accordance with the rotation position of the substrate 11. In addition, an inclination angle $\phi$ of the substrate 11 with respect to the grid 9 changes in a range of from 20° to 60° based on 40°. It is preferable that while $\phi$ is the largest in a state in which the rotation speed of the substrate 11 is the lowest, $\phi$ is the smallest in a state in which the rotation speed of the substrate 11 is the highest. Such a control allows efficient removal of a re-deposited film 50 adhered to a side wall of the TMR element 40 when the ion beam 51 enters the substrate 11 from the direction in which the pattern grooves 49 of the substrate 11 extend. Meanwhile, when the ion beam 51 hardly enters the substrate 11, entrance of the ion beam 51 from an angle close to perpendicularity to the surface of the substrate 11 allows etching of the re-deposited film 50 without blocking the ion beam 51 by the TMR elements 40 adjacent to each other.

Sixth Embodiment

In the above embodiment, with respect to the rotation phase of the substrate 11, the energy amount of the ion beam 51 entering the substrate 11 is changed with the sine wave function. Meanwhile, in this embodiment, the rotation of the substrate is stopped only when the ion beam 51 enters the substrate from the direction in which the pattern grooves 49 extend.

Figure 23:
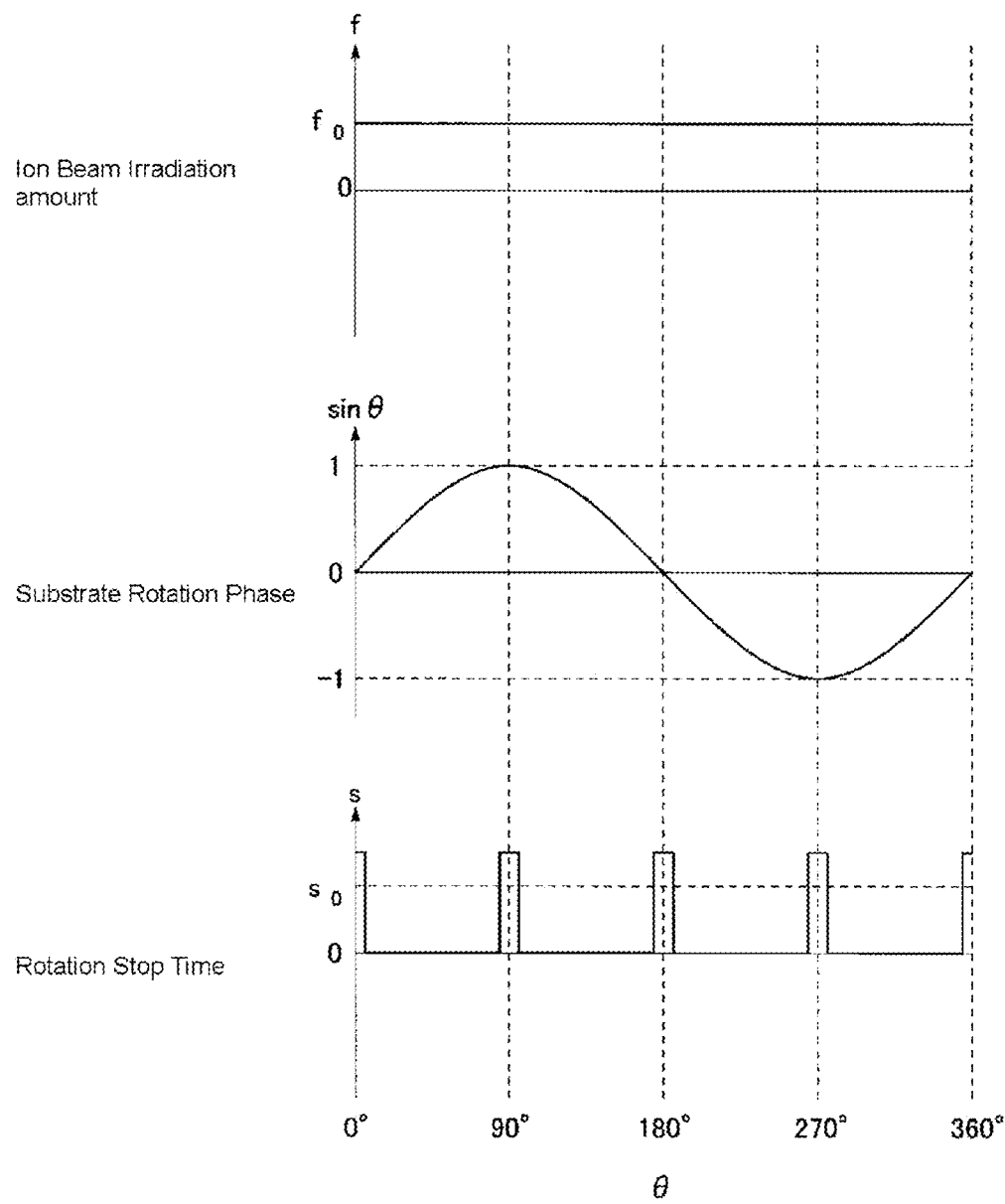
FIG. 23 is a view showing an ion beam irradiation amount, a substrate rotation phase, and a rotation stop time when a substrate is discontinuously rotated in an IBE process according to a sixth embodiment of this invention.

FIG. 23 shows a state in which the rotation stop time of the substrate 11 changes in accordance with the rotation position. The rotation of the substrate is stopped only when the ion beam 51 enters from the direction at 0°, 90°, 180°, or 270° that is the direction in which the pattern grooves 49 extend and starts the rotation again after the irradiation of the ion beam 51 for a certain time. The side wall of the TMR element 40 after actual element isolation has a certain inclination angle with respect to the substrate 11, and the ion beam 51 entering the substrate 11 is dispersed. Thus, when this embodiment is practiced, the ion beam 51 is applied to the re-deposited film 50 on the side wall of the TMR element 40.

The rotation of the substrate 11 is stopped only when the ion beam 51 enters the substrate 11 from the direction in which the pattern grooves 49 extend, and, in addition, the ion beam irradiation amount and the change in the ion beam voltage as described in the third and fourth embodiments may be combined. In this case, the energy amount of the ion beam 51 entering the substrate 11 is increased only when the ion beam 51 enters the substrate 11 from the direction in which the pattern grooves 49 extend, and in other cases, the energy amount of the ion beam 51 is reduced.

Seventh Embodiment

Figure 24:
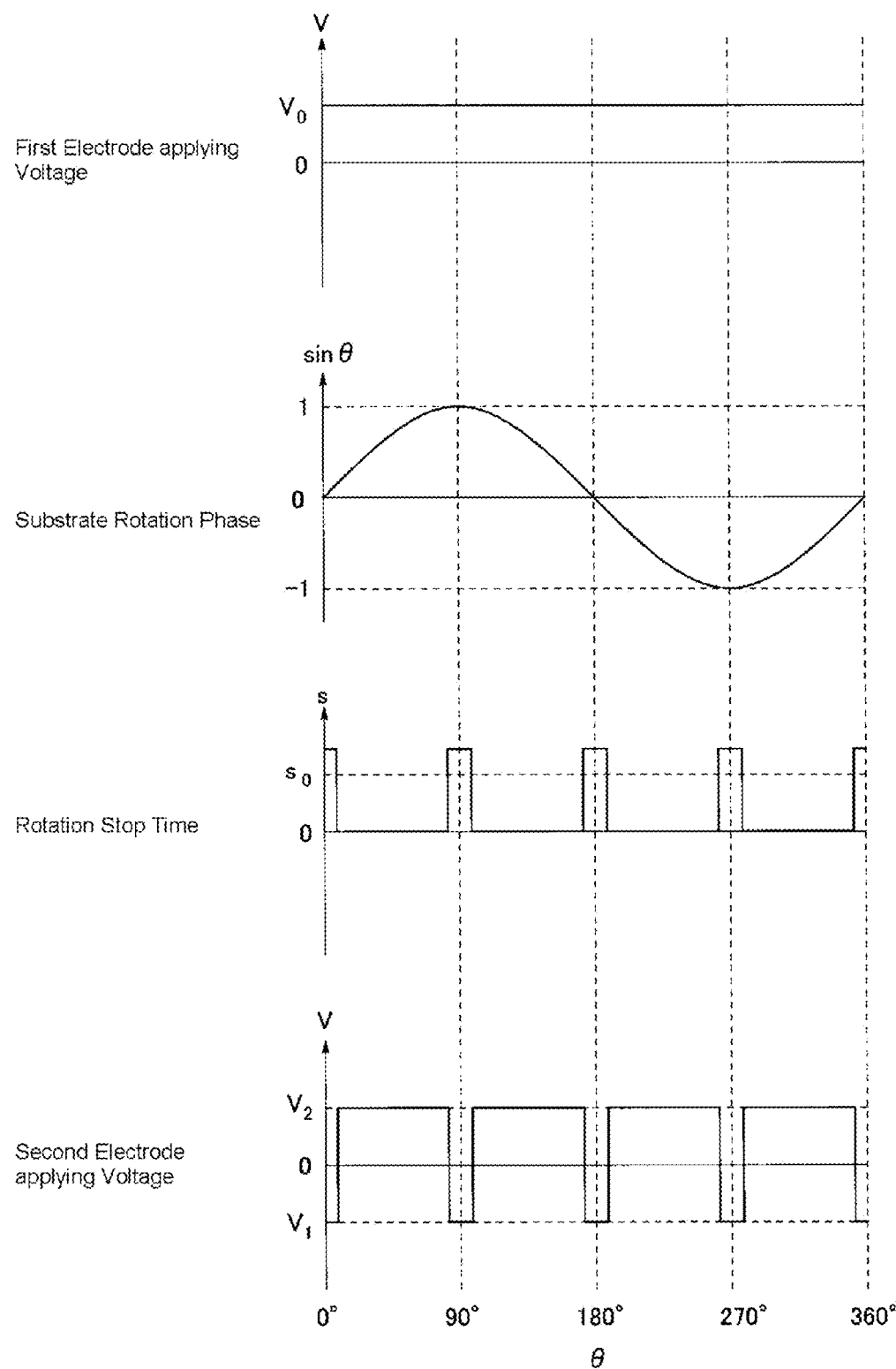
FIG. 24 is a view showing a first electrode applying voltage, a substrate rotation phase, a rotation stop time, and a second electrode applying voltage when a substrate is discontinuously rotated in an IBE process according to a seventh embodiment of this invention.

The invention according to this embodiment will be described using FIG. 24. FIG. 23 shows a state in which the rotation stop time of a substrate 11 changes in accordance with the rotation position, and a voltage applied to a second electrode 9b in a grid 9 is changed. In the sixth embodiment, the ion beam 51 is applied to the substrate 11 while the rotation of the substrate 11 is stopped only when the ion beam 51 enters the substrate 11 from the direction in which the pattern grooves 49 extend. In addition to this, this embodiment features that the entrance of the ion beam 51 to the substrate 11 is suppressed when the ion beam 51 enters from the direction in which the pattern grooves 49 do not extend.

In this embodiment, the amount of the ion beam applied to the substrate 11 is controlled by controlling the voltage of the second electrode 9b of the grid 9. Positive ions generated by a plasma generation portion 2 are accelerated by a potential difference formed between a first electrode 9a and the second electrode 9b and travel toward the substrate 11. When the voltage of the first electrode 9a is lower than the voltage of the second electrode 9b, the positive ions receive force in a direction directed from the second electrode 9b toward the first electrode 9a, and therefore, passage through the grid 9 is restricted.

This embodiment uses the above operation. When the ion beam 51 enters the substrate 11 from the direction the pattern grooves 49 extend, the ions are accelerated toward the substrate 11 while the voltage of the second electrode 9b is reduced lower than the voltage of the first electrode 9a. When the ion beam 51 enters the substrate 11 from the direction the pattern grooves 49 do not extend, the ions are confined in the plasma generation portion 2 while the voltage of the second electrode 9b is increased higher than the voltage of the first electrode 9a.

According to this embodiment, since the ion beam 51 that hardly enters the re-deposited film 50 formed on the side wall of the TMR element 40 is not applied to the substrate 11, deterioration of the shape and dimensional accuracy of the TMR element in the IBE process can be reduced.

In the above embodiment, although the bottom surfaces of all the TMR elements 40 formed on the substrate 11 have schematically rectangular shapes, when an ellipse shape is used, the effects of the present invention would be obviously obtained by practicing the invention. The above embodiment of this invention can be variously modified without departing from the scope of claims.

The energy amount of the ion beam 51 entering the substrate 11 in the third embodiment can be confirmed from a current flowing through the first electrode 9a. The plasma generated by the plasma generation portion 2 partially flows into the first electrode 9a, and the current flows through the first electrode 9a. Since the current flowing through the first electrode 9a is proportional to the amount of the plasma generated by the plasma generation portion 2, the energy amount of the ion beam 51 entering the substrate 11 can be confirmed from the current flowing through the first electrode 9a.

In every embodiment, the energy amount of the ion beam 51 in the IBE process can be measured by obtaining an electrical power W=V·I·T that is a product of a time T when the ion beam 51 is applied to the substrate 11, a voltage V applied to the first electrode 9a, and a current I flowing through the first electrode 9a.

The energy amount of the ion beam 51 entering the substrate 11 from the direction in which the pattern grooves 49 extend and the energy amount of the ion beam 51 entering the substrate 11 from the direction in which the pattern grooves 49 do not extend (an intermediate direction of the direction in which the pattern grooves 49 extend) can be compared by obtaining the electrical power W. For the patterns shown in FIG. 4 arranged in rows and columns, the energy amounts can be compared by obtaining a total of the electrical power in the IBE process determined when the incidence direction of the ion beam 51 is the direction at 0° to 22.5°, 67.5° to 112.5°, 157.5° to 202.5°, 247.5° to 292.5°, or 337.5° to 360° of the substrate phase and a total of the electrical power in the IBE process determined when the incidence direction of the ion beam 51 is the direction at 22.5° to 67.5°, 112.5° to 157.5°, 202.5° to 247.5°, or 292.5° to 337.5°.

Figure 25:
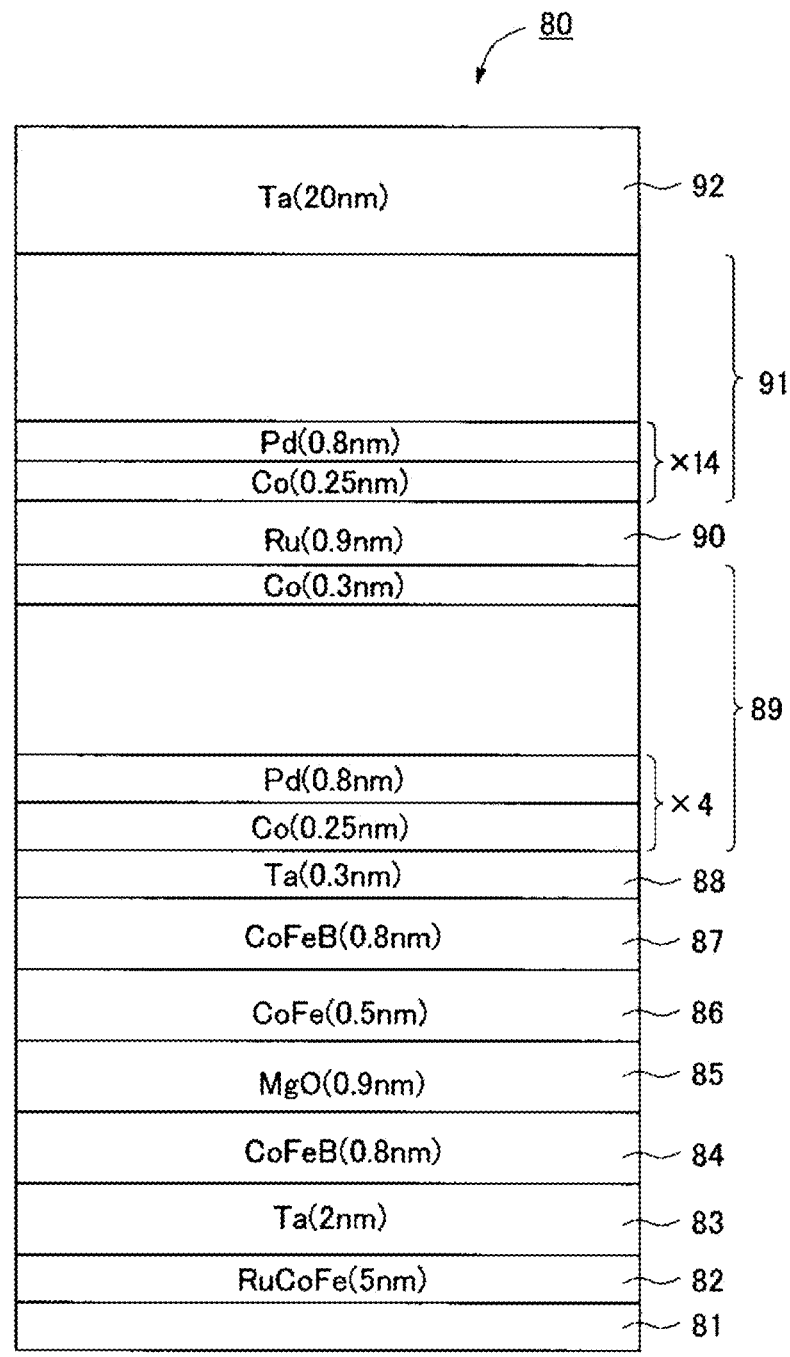
FIG. 25 is a schematic cross-sectional view showing a configuration example of a TMR element to which this invention is applicable.

An example of a laminate structure of the TMR element to which the production process according to the present invention is applicable will be described using FIG. 25. FIG. 25 is a schematic view of a laminate structure of a P-TMR element 80 in which a ferromagnetic layer is magnetized in a film thickness direction. In the P-TMR element, first, a RuCoFe layer as a buffer layer 82 and a Ta layer as a buffer layer 83 are formed on a substrate 81. A CoFeB layer as a free layer 84 which is a ferromagnetic layer is formed on the buffer layer 83, and an MgO layer as a tunnel barrier layer 85 is formed on the free layer 84. The tunnel barrier layer 85 is preferably formed of MgO to obtain a high MR ratio. The tunnel barrier layer 85 may further contain an oxide containing at least one or two or more kinds of magnesium (Mg), aluminum (Al), titanium (Ti), zing (Zn), hafnium (Hf), and germanium (Ge). A CoFe layer as a first reference layer 86 which is a ferromagnetic layer is formed on the tunnel barrier layer 85, a CoFeB layer as a second reference layer 87 which is a ferromagnetic layer is formed on the first reference layer 86, a Ta layer as an orientation isolation layer 88 is formed on the second reference layer 87, and a third reference layer 89 is formed on the orientation isolation layer 88. The third reference layer 89 has a laminate structure containing Co and Pd. In this embodiment, after Co and Pd are alternately laminated four times, Co is film-formed.

Then, a Ru layer as a nonmagnetic interlayer 90, a fourth reference layer 91, and a Ta layer as a cap layer 92 are film-formed. The fourth reference layer 91 has a laminate structure containing Co and Pd alternately laminated fourteen times.

EXPLANATION OF REFERENCE NUMBERS

1: processing space
2: plasma generation portion
3: exhaust pump
4: bell jar
5: gas introduction portion
6: RF antenna
7: matching device
8: electromagnet
9: grid
9a: first electrode
9b: second electrode
9c: third electrode
10: substrate holder
11: substrate
12: power supply for discharge
12a: feedback control section
12b: power output section
13: neutralizer
14: position sensor
15: notch
16: substrate conveyance port
17: power supply for first electrode
17a: feedback control section
17b: applied voltage output section
18: power supply for second electrode
19: orientation flat
20: controller
21: holder rotation control unit
21a: target speed calculation section
21b: drive signal generation section
22: rotation drive mechanism
22a: feedback control section
22b: holder rotation drive section
23: power control unit
23a: target power calculating section
23b: output signal generating section
24: applied voltage control unit
24a: target voltage calculating section
24b: output signal generating section
32: ridge line
33: valley line
34: front surface of substrate
35: rear surface of substrate
40: TMR element
41: lower electrode
42: antiferromagnetic layer
43: magnetization free layer (free layer)
44: tunnel barrier layer
45: magnetization fixing layer (pin layer)
46: upper electrode
48: photoresist
49: pattern groove
50: re-deposited film
51: ion beam
51c: segment obtained when ion beam is projected onto substrate
80: P-TMR element
81: substrate
82, 83: buffer layer
84: free layer (ferromagnetic layer)
85: tunnel barrier layer
86: first reference layer (ferromagnetic layer)
87: second reference layer (ferromagnetic layer)
88: orientation isolation layer
89: third reference layer
90: nonmagnetic interlayer
91: fourth reference layer
92: cap layer
100: ion beam etching apparatus
102a, 102b: direction in which pattern grooves extend 103a, 103b: direction in which pattern grooves do not extend (intermediate direction of direction in which pattern grooves extend)

The invention claimed is:

1. A process for producing a magnetoresistive effect element having two ferromagnetic layers and a tunnel barrier layer located between the two ferromagnetic layers comprising:
a step of providing a substrate in which the tunnel barrier layer is element-isolated; and
an ion-beam etching step of ion-beam etching the substrate with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate, and
when the ion beam enters from the direction the pattern groove extends, the rotation speed of the substrate is reduced lower than the rotation speed determined when the ion beam enters from another direction.

2. The process for producing a magnetoresistive effect element according to claim 1, wherein an inclination angle of the substrate with respect to the grid determined when the ion beam enters from the direction in which the pattern groove extends is larger than the inclination angle of the substrate with respect to the grid determined when the ion beam enters from another direction.

3. A process for producing a magnetoresistive effect element having two ferromagnetic layers and a tunnel barrier layer located between the two ferromagnetic layers comprising:
a step of providing a substrate in which the tunnel barrier layer is element-isolated; and
an ion-beam etching step of ion-beam etching the substrate with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate,
the rotation of the substrate repeats the rotation and stop, and
a rotation stop time of the substrate determined when the ion beam enters from the direction in which the pattern groove extends is increased longer than that determined when the ion beam enters from another direction.

4. A process for producing a magnetoresistive effect element having two ferromagnetic layers and a tunnel barrier layer located between the two ferromagnetic layers comprising:
a step of providing a substrate in which the tunnel barrier layer is element-isolated; and
an ion-beam etching step of ion-beam etching the substrate with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate, and
an electrical power applied to a plasma source used for generating the ion beam is controlled to increase an ion density of the ion beam entering from the direction in which the pattern groove extends more than the density of the ion beam entering from another direction.

5. A process for producing a magnetoresistive effect element having two ferromagnetic layers and a tunnel barrier layer located between the two ferromagnetic layers comprising:
a step of providing a substrate in which the tunnel barrier layer is element-isolated, and
an ion-beam etching step of ion-beam etching the substrate with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate,
the grid comprises an extraction electrode, an acceleration electrode, and a ground electrode, and
a voltage applied to the extraction electrode when the ion beam enters from the direction in which the pattern groove extends is increased higher than a voltage applied to the extraction electrode when the ion beam enters from another direction.

6. A process for producing a magnetoresistive effect element having two ferromagnetic layers and a tunnel barrier layer located between the two ferromagnetic layers comprising:
a step of providing a substrate in which the tunnel barrier layer is element-isolated; and
an ion-beam etching step of ion-beam etching the substrate with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate,
the rotation of the substrate repeats the rotation and stop, and
the rotation of the substrate is stopped when the ion beam enters from the direction in which the pattern groove extends.

7. The process for producing a magnetoresistive effect element according to claim 6, wherein
the grid comprises an extraction electrode, an acceleration electrode, and a ground electrode, and
when the ion beam enters the direction in which the pattern groove extends, a voltage of the acceleration electrode is reduced lower than a voltage of the extraction electrode, and when the ion beam enters from another direction, the voltage of the acceleration electrode is increased higher than the voltage of the extraction electrode.

8. A device producing method comprising:
a step of providing a substrate on which a pattern is formed; and
an ion beam etching step of ion-beam etching a side wall of the pattern with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate, and
when the ion beam enters from the direction the pattern groove extends, the rotation speed of the substrate is reduced lower than the rotation speed determined when the ion beam enters from another direction.

9. A device producing method comprising:
a step of providing a substrate on which a pattern is formed; and
an ion beam etching step of ion-beam etching a side wall of the pattern with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate,
the rotation of the substrate repeats the rotation and stop, and
a rotation stop time of the substrate determined when the ion beam enters from the direction in which the pattern groove extends is increased longer than that determined when the ion beam enters from another direction.

10. A device producing method comprising:
a step of providing a substrate on which a pattern is formed; and
an ion beam etching step of ion-beam etching a side wall of the pattern with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate, and
an electrical power applied to a plasma source used for generating the ion beam is controlled to increase an ion density of the ion beam entering from the direction in which the pattern groove extends more than the density of the ion beam entering from another direction.

11. A device producing method comprising:
a step of providing a substrate on which a pattern is formed; and
an ion beam etching step of ion-beam etching a side wall of the pattern with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate,
the grid comprises an extraction electrode, an acceleration electrode, and a ground electrode, and
a voltage applied to the extraction electrode when the ion beam enters from the direction in which the pattern groove extends is increased higher than a voltage applied to the extraction electrode when the ion beam enters from another direction.

12. A device producing method comprising:
a step of providing a substrate on which a pattern is formed; and
an ion beam etching step of ion-beam etching a side wall of the pattern with an ion beam extracted from a grid,
wherein in the ion beam etching step, the substrate is located being inclined relative to the grid, and an energy amount of an ion beam entering from a direction in which a pattern groove formed on the substrate extends is larger than the energy amount of the ion beam entering from another direction, and
wherein
in the ion beam etching step, the substrate is rotated in an in-plane direction of the substrate,
the rotation of the substrate repeats the rotation and stop, and
the rotation of the substrate is stopped when the ion beam enters from the direction in which the pattern groove extends.

* * * * *